US012068398B2

(12) United States Patent
Hsiao et al.

(10) Patent No.: US 12,068,398 B2
(45) Date of Patent: Aug. 20, 2024

(54) FIN FIELD-EFFECT TRANSISTOR WITH VOID AND METHOD OF FORMING THE SAME

(71) Applicant: Taiwan Semiconductor Manufacturing Company, Ltd., Hsinchu (TW)

(72) Inventors: Hsu Ming Hsiao, Hsinchu (TW); Ming-Jhe Sie, Taipei (TW); Hsiu-Hao Tsao, Taichung (TW); Hong Pin Lin, Hsinchu (TW); Che-fu Chen, Taipei (TW); An Chyi Wei, Hsinchu (TW); Yi-Jen Chen, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 18/306,769

(22) Filed: Apr. 25, 2023

(65) Prior Publication Data
US 2023/0268427 A1    Aug. 24, 2023

Related U.S. Application Data

(63) Continuation of application No. 17/205,120, filed on Mar. 18, 2021, now Pat. No. 11,664,444.

(Continued)

(51) Int. Cl.
*H01L 29/66* (2006.01)
*H01L 21/3105* (2006.01)
(Continued)

(52) U.S. Cl.
CPC .... *H01L 29/6681* (2013.01); *H01L 21/31055* (2013.01); *H01L 21/823418* (2013.01);
(Continued)

(58) Field of Classification Search
CPC ............ H01L 29/6653; H01L 29/6656; H01L 21/823468; H01L 21/823864;
(Continued)

(56) References Cited

U.S. PATENT DOCUMENTS

2015/0263122 A1    9/2015  Hsiao et al.
2018/0233398 A1*   8/2018  Van Cleemput ..........................
                                                      H01L 29/66795

(Continued)

FOREIGN PATENT DOCUMENTS

TW           202008471 A       2/2020

OTHER PUBLICATIONS

Non-Final Office Action on U.S. Appl. No. 17/205,120 DTD May 25, 2022.

(Continued)

*Primary Examiner* — Sonya McCall-Shepard
(74) *Attorney, Agent, or Firm* — FOLEY & LARDNER LLP

(57) ABSTRACT

A method, for making a semiconductor device, includes forming a first fin over a substrate. The method includes forming a dummy gate stack on the first fin. The method includes forming a first gate spacer along a side of the dummy gate stack. The first gate spacer includes a first dielectric material. The method includes forming a second gate spacer along a side of the first gate spacer. The second gate spacer includes a semiconductor material. The method includes forming a source/drain region in the first fin adjacent the second gate spacer. The method includes removing at least a portion of the second gate spacer to form a void extending between the first gate spacer and the source/drain region.

20 Claims, 35 Drawing Sheets

Related U.S. Application Data

(60) Provisional application No. 63/031,127, filed on May 28, 2020.

(51) Int. Cl.
    *H01L 21/3213* (2006.01)
    *H01L 21/8234* (2006.01)
    *H01L 21/8238* (2006.01)
    *H01L 29/165* (2006.01)
    *H01L 29/49* (2006.01)
    *H01L 29/78* (2006.01)

(52) U.S. Cl.
    CPC ............... *H01L 21/823431* (2013.01); *H01L 21/823468* (2013.01); *H01L 29/6653* (2013.01); *H01L 29/66545* (2013.01); *H01L 29/6656* (2013.01)

(58) Field of Classification Search
    CPC ............ H01L 29/0649; H01L 21/764; H01L 21/7682; H01L 29/4991; H01L 21/823878
    See application file for complete search history.

(56) References Cited

U.S. PATENT DOCUMENTS

| | | |
|---|---|---|
| 2018/0331097 A1 | 11/2018 | Zang et al. |
| 2019/0013390 A1 | 1/2019 | Cheng et al. |
| 2019/0296123 A1 | 9/2019 | Lee et al. |
| 2020/0105867 A1* | 4/2020 | Lee ................. H01L 21/764 |
| 2020/0135880 A1 | 4/2020 | Chen et al. |
| 2020/0135889 A1* | 4/2020 | Chien ............. H01L 29/0649 |

OTHER PUBLICATIONS

Non-Final Office Action on U.S. Appl. No. 17/205,120 DTD Sep. 15, 2022.

Notice of Allowance on U.S. Appl. No. 17/205,120 DTD Jan. 25, 2023.

Taiwan Office Action on TW Patent Appl. No. 110117451 dated Aug. 30, 2021 (8 pages).

* cited by examiner

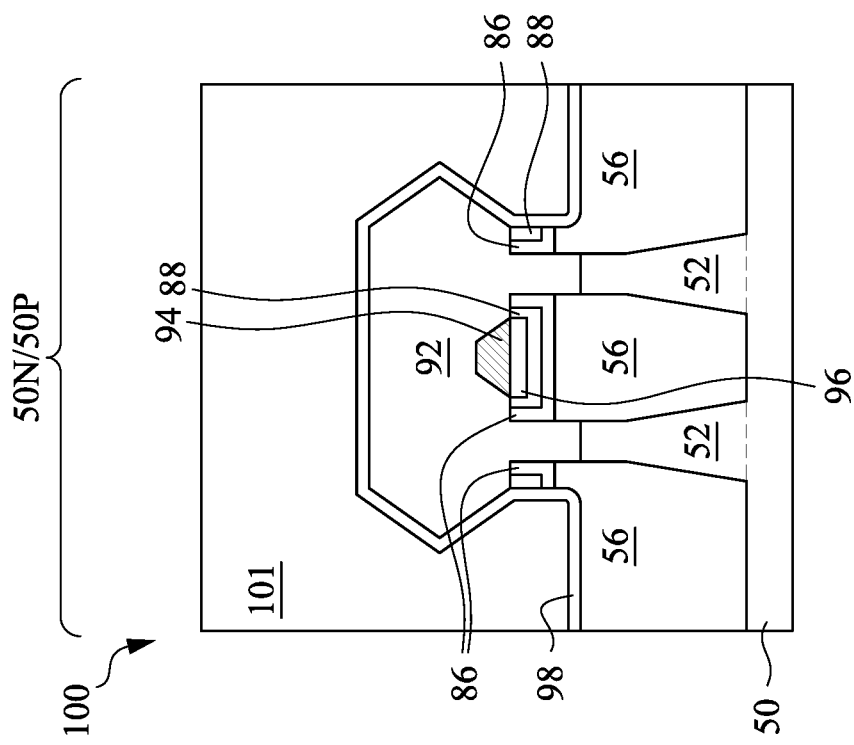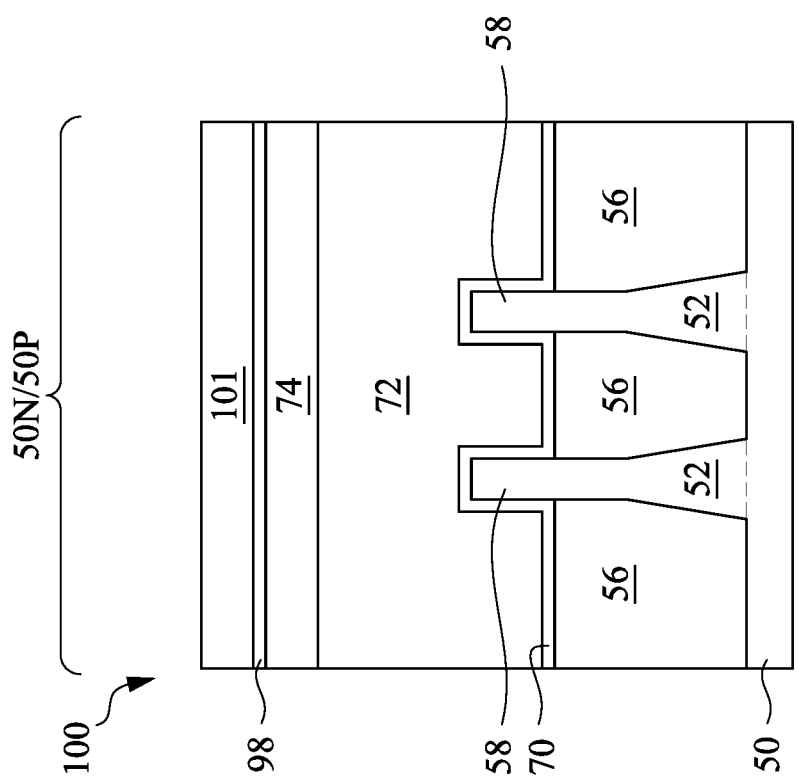
Fig. 9E
Fig. 9D

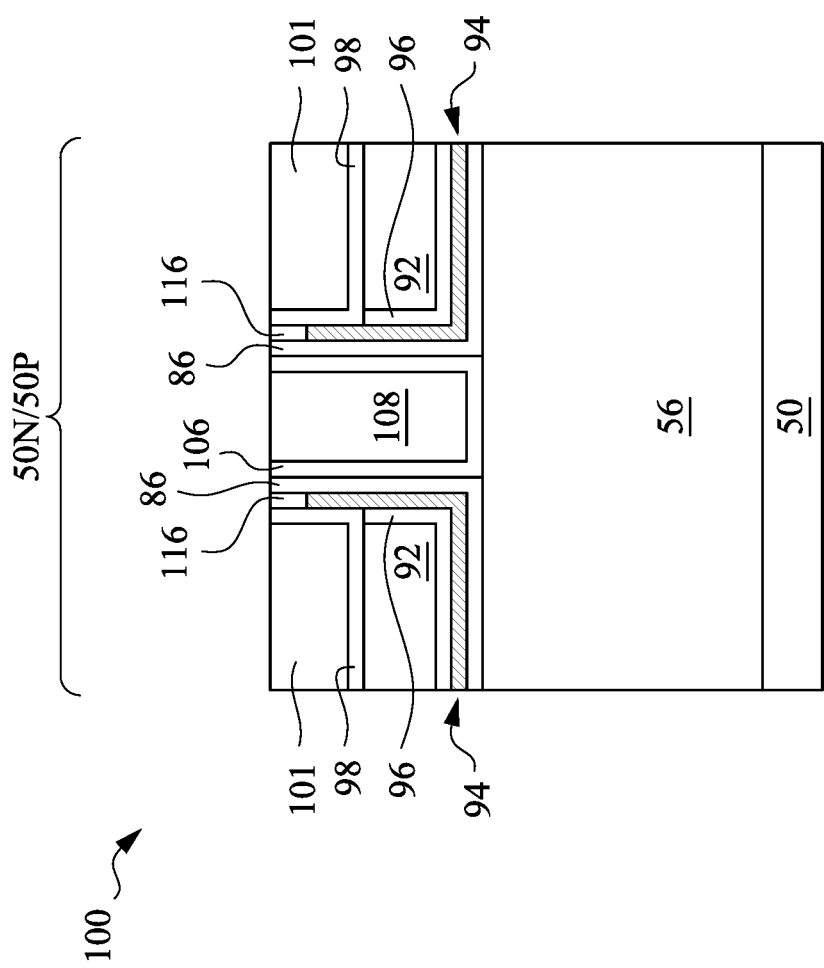

FIN FIELD-EFFECT TRANSISTOR WITH VOID AND METHOD OF FORMING THE SAME

CROSS-REFERENCE TO RELATED APPLICATIONS

This application is a continuation of U.S. Utility application Ser. No. 17/205,120, which claims the benefit of and priority to U.S. Provisional Patent App. No. 63/031,127, filed May 28, 2020, the entire contents of both of which are incorporated herein by reference for all purposes.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2, 3, 4, 5, 6, 7A, 7B, 7C, 7D, 7E, 8A, 8B, 8C, 8D, 8E, 9A, 9B, 9C, 9D, 9E, 10A, 10B, 10C, 10D, 10E, 11A, 11B, 11C, 11D, 11E, 12A, 12B, 12C, 12D, 12E, 12F, 13A, 13B, 13C, 13D, 13E, 14A, 14B, 14C, 14D, 14E, 15A, 15B, 15C, 15D, and 15E illustrate cross-sectional views of the example FinFETs of FIG. 1 during various fabrication stages, in accordance with some embodiments.

DETAILED DESCRIPTION

Figure 1:
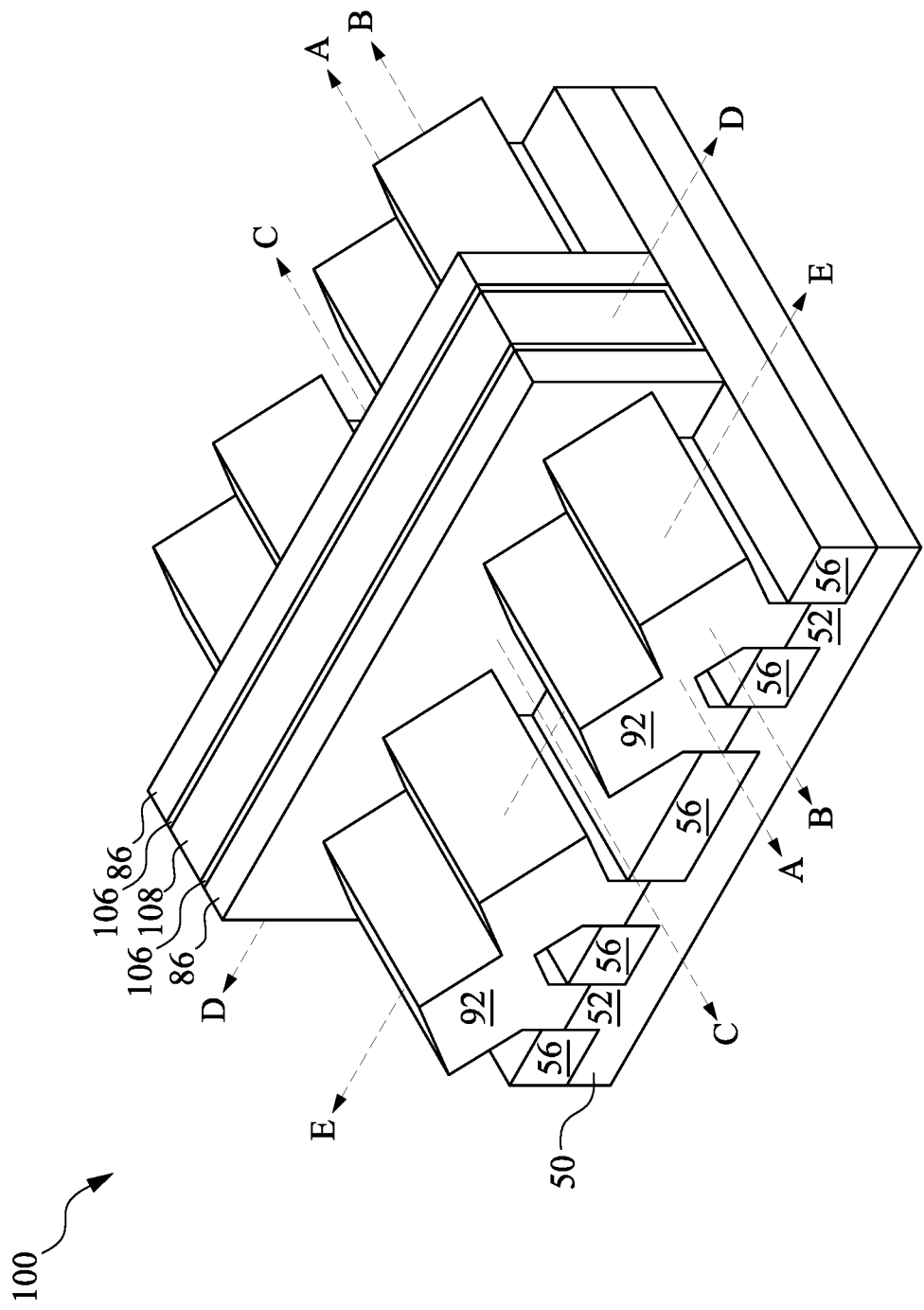
FIG. 1 illustrates a perspective view of Fin Field-Effect Transistors (FinFETs), in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, multiple gate spacers are formed for a FinFET, and one of the gate spacers is removed to define a void in the resulting FinFET. The void occupies at least a portion of the region formerly occupied by the removed gate spacer, and remains in the final FinFET device. The voids may be filled with air or may be at a vacuum, such that regions between the gate electrodes and source/drain regions of the FinFET can have a low relative permittivity. The capacitance between the gate electrodes and source/drain contacts of the FinFET may thus be reduced, thereby reducing current leakage in the FinFET.

FIG. 1 illustrates an example of simplified Fin Field-Effect Transistors (FinFETs) 100 in a perspective view, in accordance with various embodiments. Some other features of the FinFETs (discussed below) are omitted for illustration clarity. The illustrated FinFETs may be electrically connected or coupled in a manner to operate as, for example, one transistor or multiple transistors, such as two transistors.

The FinFETs 100 include fins 52 extending from a substrate 50. Isolation regions 56 are disposed over the substrate 50, and the fins 52 protrude above and from between neighboring isolation regions 56. Although the isolation regions 56 are described/illustrated as being separate from the substrate 50, as used herein the term "substrate" may be used to refer to just the semiconductor substrate or a semiconductor substrate inclusive of isolation regions. Additionally, although the fins 52 are illustrated as being a single, continuous material of the substrate 50, the fins 52 and/or the substrate 50 may comprise a single material or a plurality of materials. In this context, the fins 52 refers to the portions extending between the neighboring isolation regions 56.

Gate dielectrics 106 are along sidewalls and over top surfaces of the fins 52, and gate electrodes 108 are over the gate dielectrics 106. Source/drain regions 92 are disposed in opposite sides of the fin 52 with respect to the gate dielectrics 106 and gate electrodes 108. Gate spacers 86 separate the source/drain regions 92 from the gate dielectrics 106 and gate electrodes 108. In embodiments where multiple transistors are formed, the source/drain regions 92 may be shared between various transistors. In embodiments where one transistor is formed from multiple fins 52, neighboring source/drain regions 92 may be electrically connected, such as through coalescing the source/drain regions 92 by epitaxial growth, or through coupling the source/drain regions 92 with a same source/drain contact.

FIG. 1 further illustrates several reference cross-sections. For example, cross-section A-A is along portions of the isolation regions 56 beneath neighboring source/drain regions 92; cross-section B-B is parallel to cross-section A-A and is along a longitudinal axis of a fin 52; cross-section C-C is parallel to cross-section A-A and is along portions of the isolation regions 56 between coalesced source/drain regions 92; cross-section D-D is perpendicular to cross-section A-A and is along a longitudinal axis of a gate electrode 108; and cross-section E-E is perpendicular to cross-section A-A and is across neighboring source/drain regions 92. Subsequent figures refer to these reference cross-sections for clarity.

Some embodiments discussed herein are discussed in the context of FinFETs formed using a gate-last process. In other embodiments, a gate-first process may be used. Also, some embodiments contemplate aspects used in planar devices, such as planar FETs, and/or other non-planar devices, such as gate-all-around (GAA) transistors.

FIGS. 2, 3, 4, 5, and 6 illustrate perspective views of intermediate stages in manufacturing the example FinFETs 100, in accordance with some embodiments.

Figure 2:
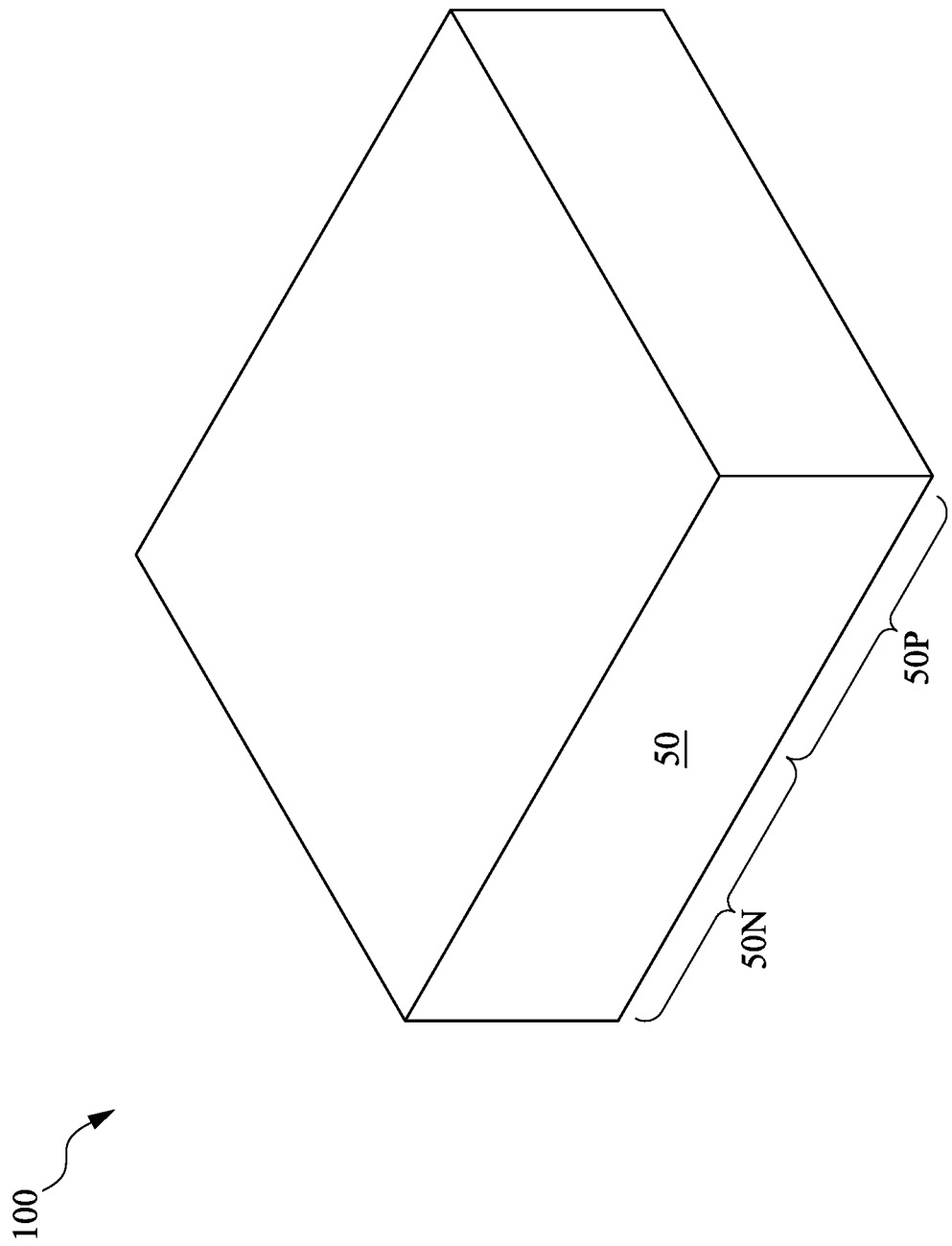

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

The substrate 50 has a region 50N and a region 50P. The region 50N can be for forming n-type devices, such as NMOS transistors, e.g., n-type FinFETs. The region 50P can be for forming p-type devices, such as PMOS transistors, e.g., p-type FinFETs. The region 50N may be physically separated from the region 50P, and any number of device features (e.g., other active devices, doped regions, isolation structures, etc.) may be disposed between the region 50N and the region 50P.

Figure 3:
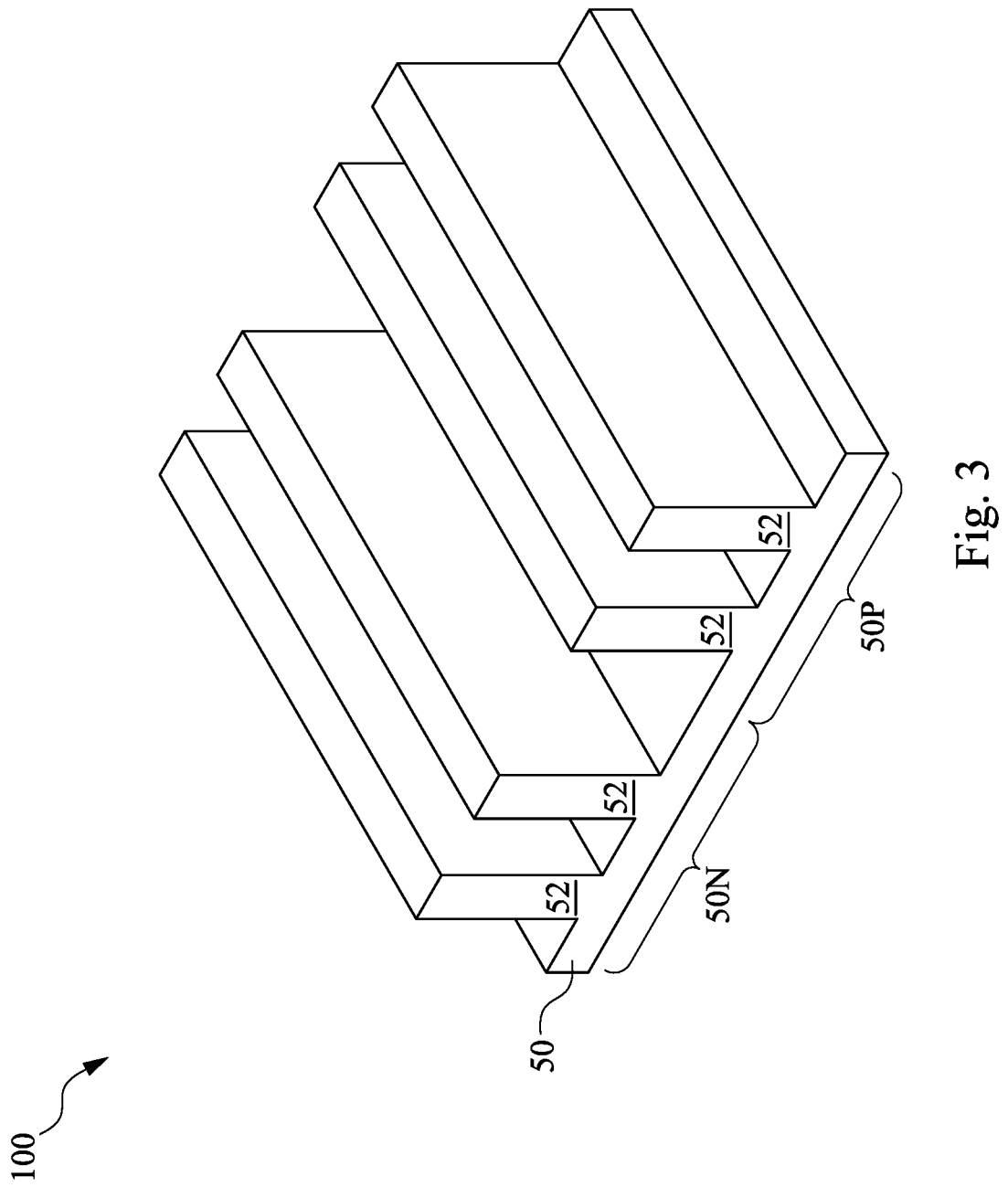

In FIG. 3, the fins 52 are formed in the substrate 50. The fins 52 are semiconductor strips. In some embodiments, the fins 52 may be formed in the substrate 50 by etching trenches in the substrate 50. The etching may be any acceptable etch process, such as a reactive ion etch (ME), neutral beam etch (NBE), the like, or a combination thereof. The etch may be anisotropic.

The fins 52 may be patterned by any suitable method. For example, the fins 52 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

Figure 4:
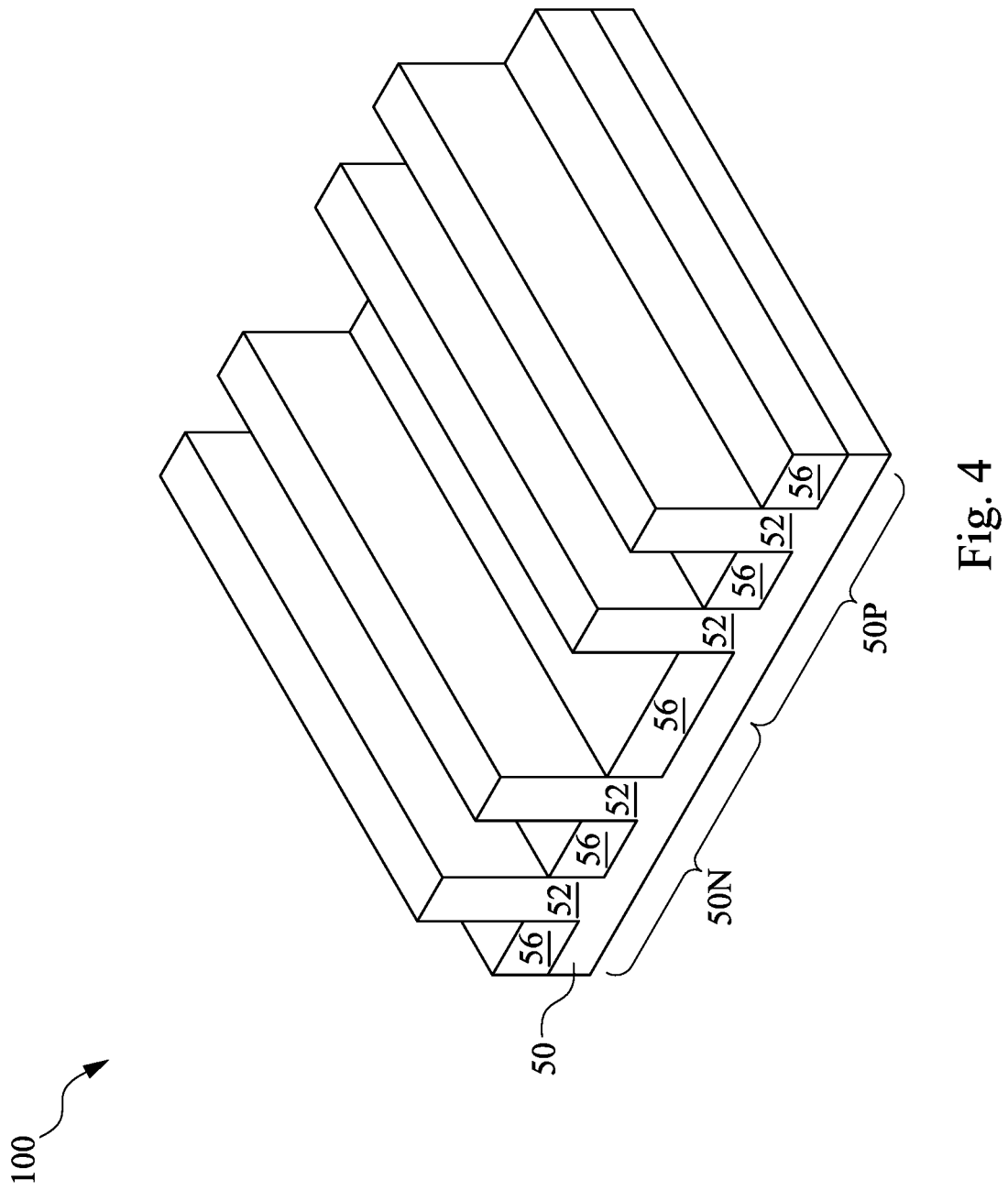

In FIG. 4, the isolation regions 56 (which are sometimes referred to as Shallow Trench Isolation (STI) 56) are formed over the substrate 50 and between neighboring fins 52. As an example to form the STI regions 56, an insulation material is formed over the intermediate structure. The insulation material may be an oxide, such as silicon oxide, a nitride, the like, or a combination thereof, and may be formed by a high density plasma chemical vapor deposition (HDP-CVD), a flowable chemical vapor deposition (FCVD) (e.g., a chemical vapor deposition (CVD) based material deposition in a remote plasma system and post curing to make it convert to another material, such as an oxide), the like, or a combination thereof. Other insulation materials formed by any acceptable process may be used. In the illustrated embodiment, the insulation material is silicon oxide formed by a FCVD process. An anneal process may be performed once the insulation material is formed. In an embodiment, the insulation material is formed such that excess insulation material covers the fins 52. Some embodiments may utilize multiple layers. For example, in some embodiments a liner (not shown) may first be formed along a surface of the substrate 50 and the fins 52. Thereafter, a fill material, such as those discussed above may be formed over the liner. A removal process is applied to the insulation material to remove excess insulation material over the fins 52. In some embodiments, a planarization process such as a chemical mechanical polish (CMP), an etch back process, combinations thereof, or the like may be utilized. The planarization process exposes the fins 52 such that top surfaces of the fins 52 and the insulation material are level after the planarization process is complete. The insulation material is then recessed, with remaining portions of the insulation material forming the STI regions 56. The insulation material is recessed such that upper portions of fins 52 in the region 50N and in the region 50P protrude from between neighboring STI regions 56. Further, the top surfaces of the STI regions 56 may have a flat surface as illustrated, a convex surface, a concave surface (such as dishing), or a combination thereof. The top surfaces of the STI regions 56 may be formed flat, convex, and/or concave by an appropriate etch. The STI regions 56 may be recessed using an acceptable etching process, such as one that is selective to the material of the insulation material (e.g., etches the material of the insulation material at a faster rate than the material of the fins 52). For example, a chemical oxide removal with a suitable etch process using, for example, dilute hydrofluoric (dHF) acid may be used.

The process described above is just one example of how the fins 52 may be formed. In some embodiments, the fins may be formed by an epitaxial growth process. For example, a dielectric layer can be formed over a top surface of the substrate 50, and trenches can be etched through the dielectric layer to expose the underlying substrate 50. Homoepitaxial structures can be epitaxially grown in the trenches, and the dielectric layer can be recessed such that the homoepitaxial structures protrude from the dielectric layer to form fins. Additionally, in some embodiments, heteroepitaxial structures can be used for the fins 52. For example, after the insulation material of the STI regions 56 is planarized with the fins 52, the fins 52 can be recessed, and a material different from the fins 52 may be epitaxially grown over the recessed fins 52. In such embodiments, the fins 52 comprise the recessed material as well as the epitaxially grown material disposed over the recessed material. In an even further embodiment, a dielectric layer can be formed over a top surface of the substrate 50, and trenches can be etched through the dielectric layer. Heteroepitaxial structures can then be epitaxially grown in the trenches using a material different from the substrate 50, and the dielectric layer can be recessed such that the heteroepitaxial structures protrude from the dielectric layer to form the fins 52. In some embodiments where homoepitaxial or heteroepitaxial structures are epitaxially grown, the epitaxially grown materials may be in situ doped during growth, which may obviate prior and subsequent implantations although in situ and implantation doping may be used together.

Still further, it may be advantageous to epitaxially grow a material in region 50N (e.g., an NMOS region) different from the material in region 50P (e.g., a PMOS region). In various embodiments, upper portions of the fins 52 may be formed from silicon germanium ($Si_xGe_{1-x}$, where x can be in the range of 0 to 1), silicon carbide, pure or substantially pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like.

Further, appropriate wells (not shown) may be formed in the fins 52 and/or the substrate 50. In some embodiments, a P well may be formed in the region 50N, and an N well may be formed in the region 50P. In some embodiments, a P well or an N well are formed in both the region 50N and the region 50P.

In the embodiments with different well types, the different implant steps for the region 50N and the region 50P may be achieved using a photoresist or other masks (not shown). For example, a photoresist may be formed over the fins 52 and the STI regions 56 in the region 50N. The photoresist is patterned to expose the region 50P of the substrate 50, such as a PMOS region. The photoresist can be formed by using a spin-on technique and can be patterned using acceptable photolithography techniques. Once the photoresist is patterned, an n-type impurity implant is performed in the region 50P, and the photoresist may act as a mask to substantially prevent n-type impurities from being implanted into the region 50N, such as an NMOS region. The n-type impurities may be phosphorus, arsenic, antimony, or the like implanted in the region to a concentration of equal to or less than $10^{18}$ $cm^{-3}$, such as between about $10^{17}$ $cm^{-3}$ and about $10^{18}$ $cm^{-3}$. After the implant, the photoresist is removed, such as by an acceptable ashing process.

Following the implanting of the region 50P, a photoresist is formed over the fins 52 and the STI regions 56 in the region 50P. The photoresist is patterned to expose the region 50N of the substrate 50, such as the NMOS region. The photoresist can be formed by using a spin-on technique and can be patterned using acceptable photolithography techniques. Once the photoresist is patterned, a p-type impurity implant may be performed in the region 50N, and the photoresist may act as a mask to substantially prevent p-type impurities from being implanted into the region 50P, such as the PMOS region. The p-type impurities may be boron, $BF_2$, indium, or the like implanted in the region to a concentration of equal to or less than $10^{18}$ $cm^{-3}$, such as between about $10^{17}$ $cm^{-3}$ and about $10^{18}$ $cm^{-3}$. After the implant, the photoresist may be removed, such as by an acceptable ashing process.

After implanting the region 50N and the region 50P, an anneal may be performed to activate the p-type and/or n-type impurities that were implanted. In some embodiments, the grown materials of epitaxial fins may be in situ doped during growth, which may obviate the implantations, although in situ and implantation doping may be used together.

Figure 5:
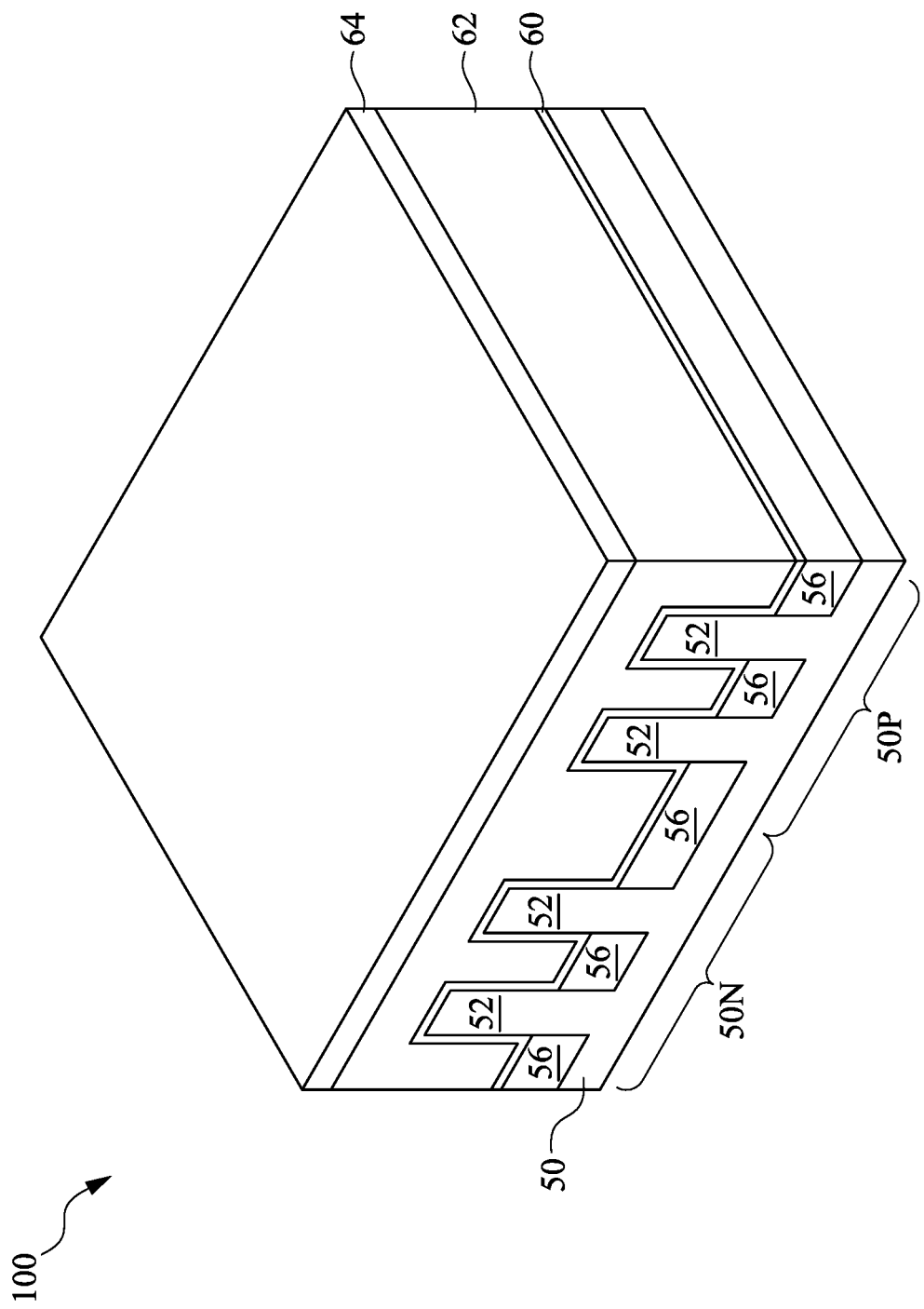

In FIG. 5, a dummy dielectric layer 60 is formed on the fins 52. The dummy dielectric layer 60 may be, for example, silicon oxide, silicon nitride, a combination thereof, or the like, and may be deposited or thermally grown according to acceptable techniques. A dummy gate layer 62 is formed over the dummy dielectric layer 60, and a mask layer 64 is formed over the dummy gate layer 62. The dummy gate layer 62 may be deposited over the dummy dielectric layer 60 and then planarized, such as by a CMP. The mask layer 64 may be deposited over the dummy gate layer 62. The dummy gate layer 62 may be a conductive material and may be selected from a group including amorphous silicon, polycrystalline-silicon (polysilicon), polycrystalline silicon-germanium (poly-SiGe), metallic nitrides, metallic silicides, metallic oxides, and metals. The dummy gate layer 62 may be deposited by physical vapor deposition (PVD), CVD, sputter deposition, or other techniques known and used in the art for depositing conductive materials. The dummy gate layer 62 may be made of other materials that have a high etching selectivity from the etching of isolation regions. The mask layer 64 may include, for example, SiN, SiON, or the like. In this example, a single dummy gate layer 62 and a single mask layer 64 are formed across the region 50N and the region 50P. It is noted that the dummy dielectric layer 60 is shown covering only the fins 52 for illustrative purposes only. In some embodiments, the dummy dielectric layer 60 may be deposited such that the dummy dielectric layer 60 covers the STI regions 56, extending between the dummy gate layer 62 and the STI regions 56.

Figure 6:
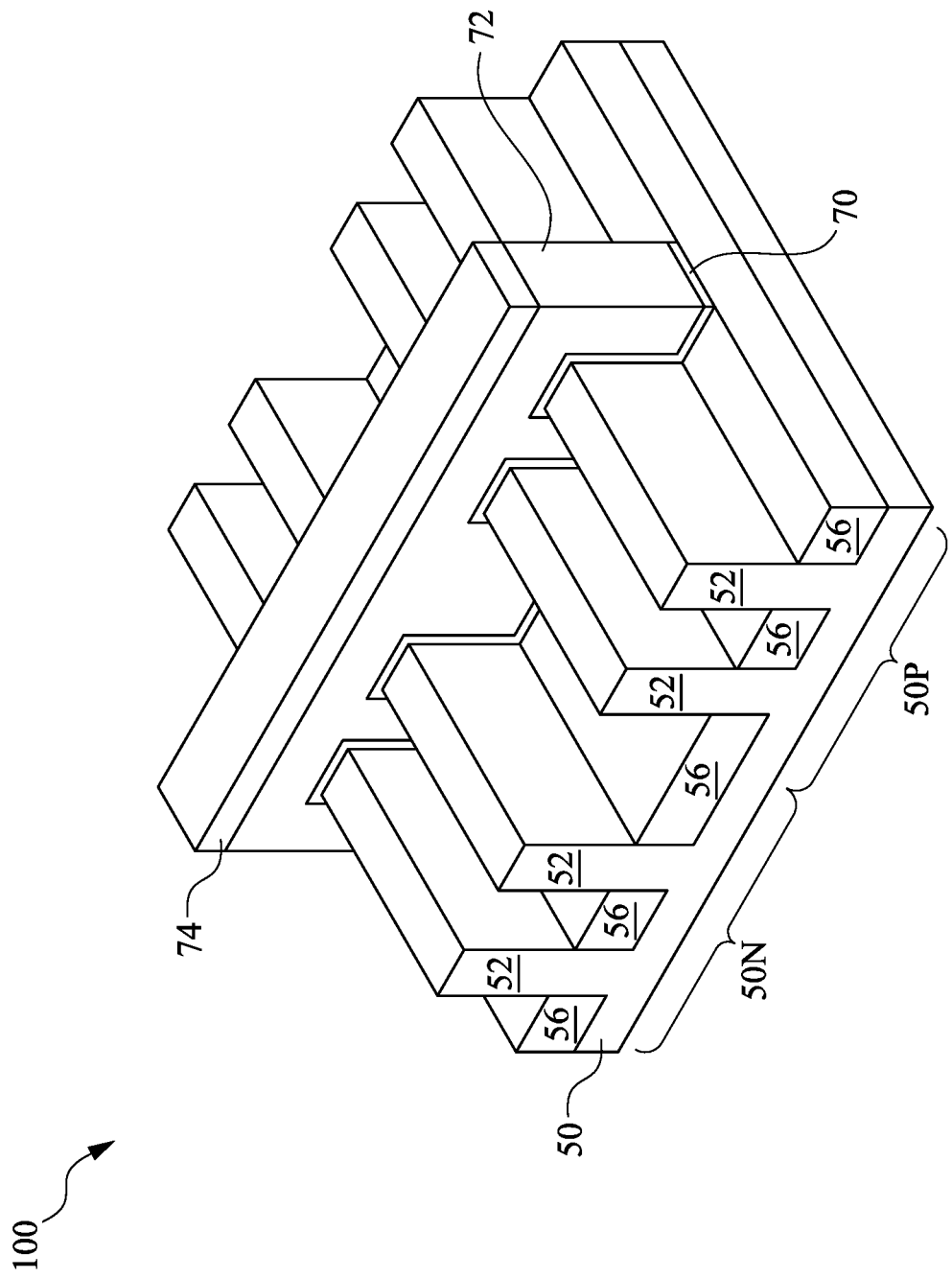
Figure 7A:
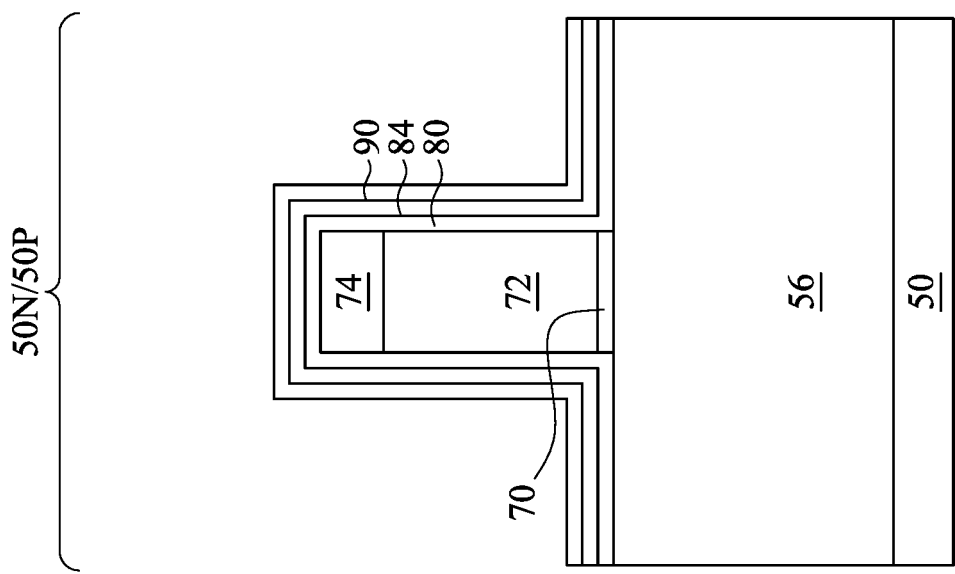
Figure 7C:
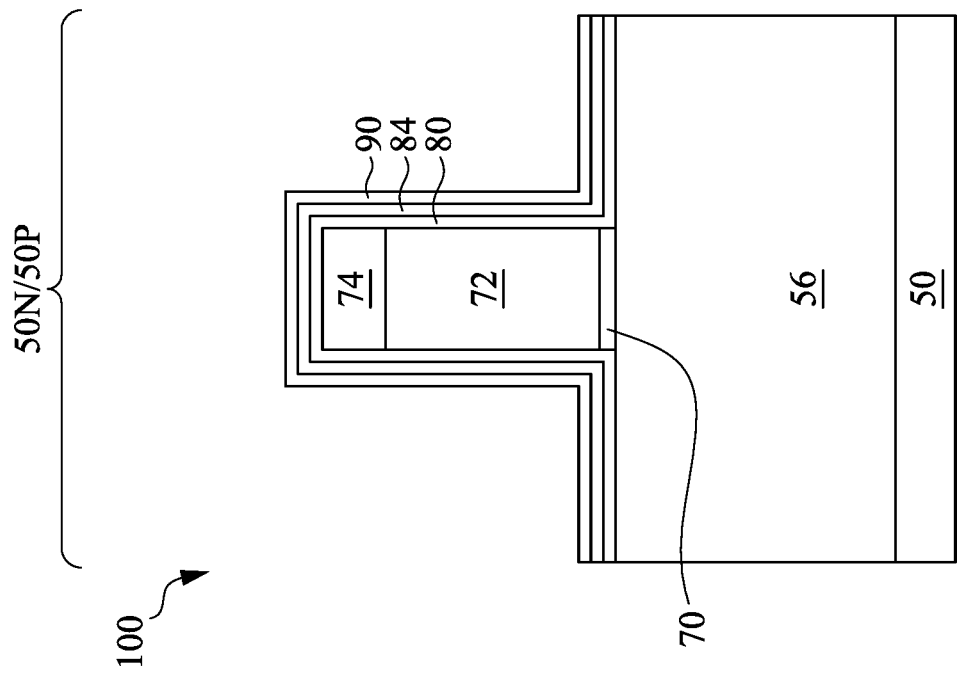
Figure 7B:
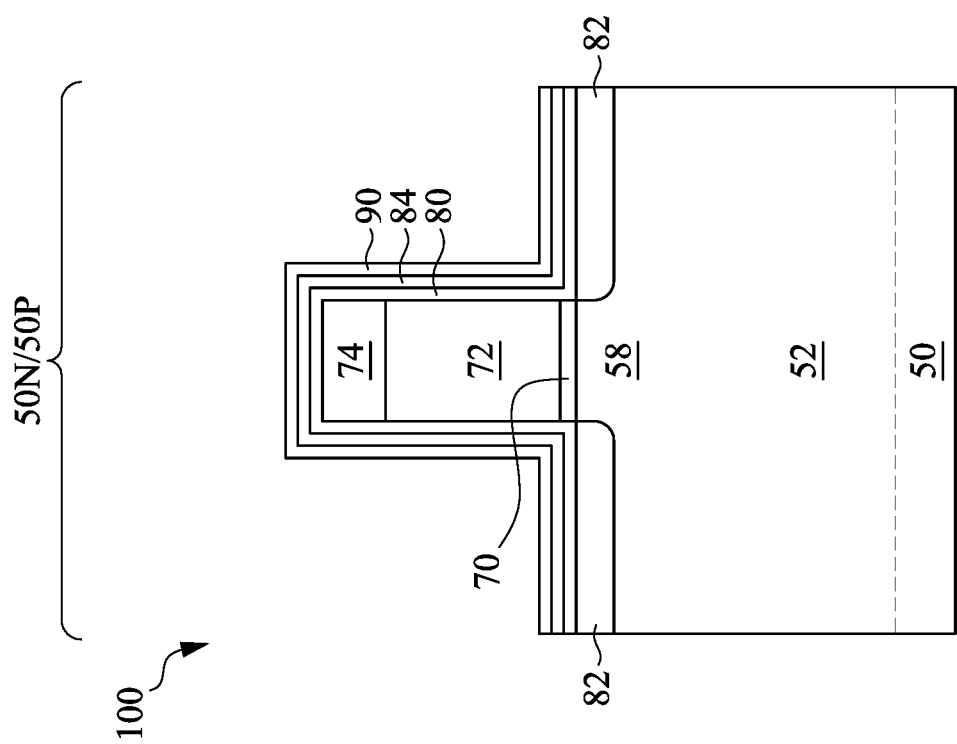
Figure 7E:
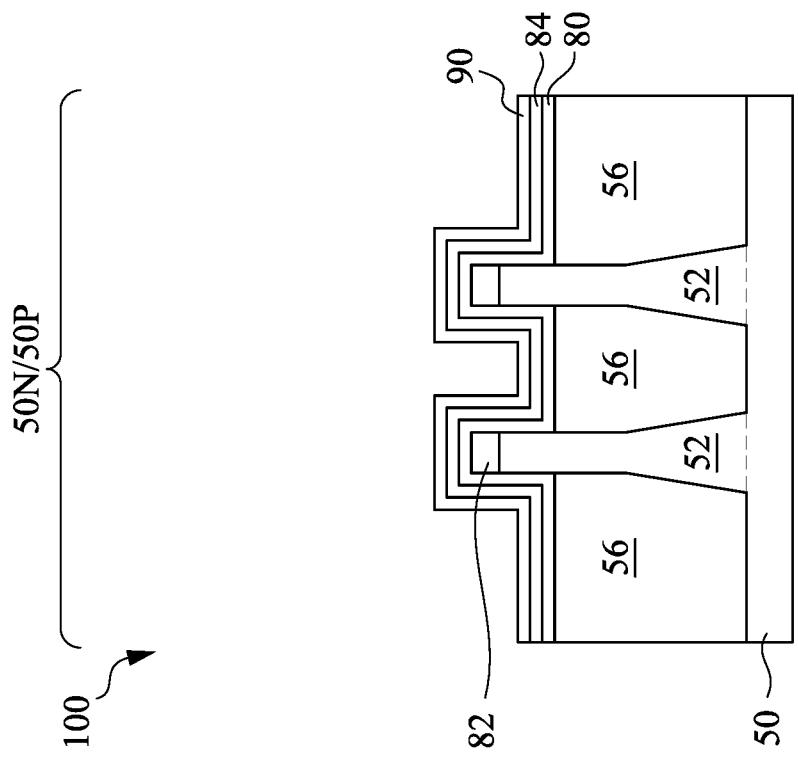
Figure 7D:
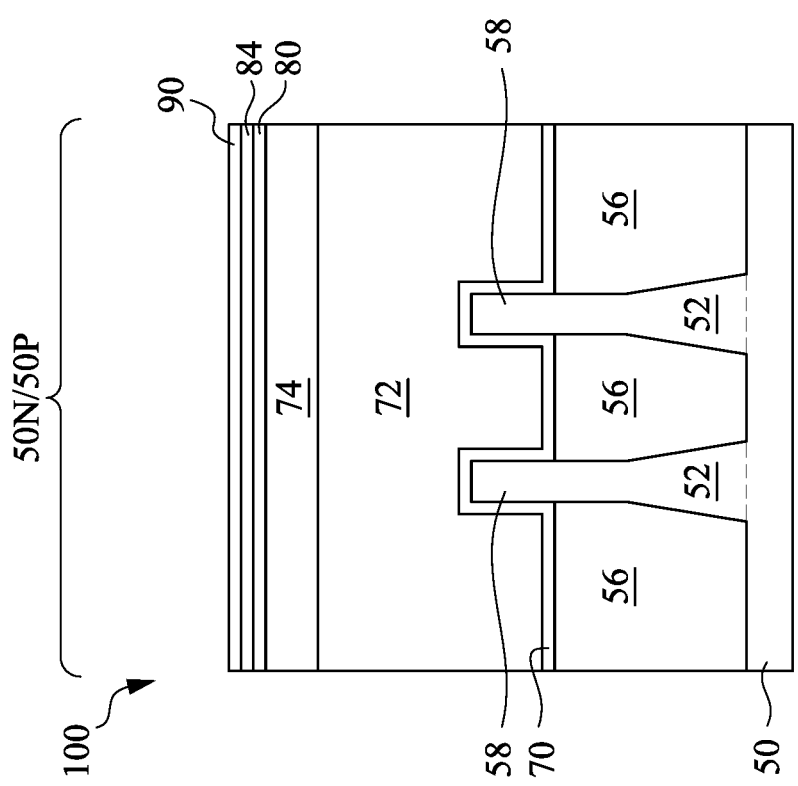
Figure 8A:
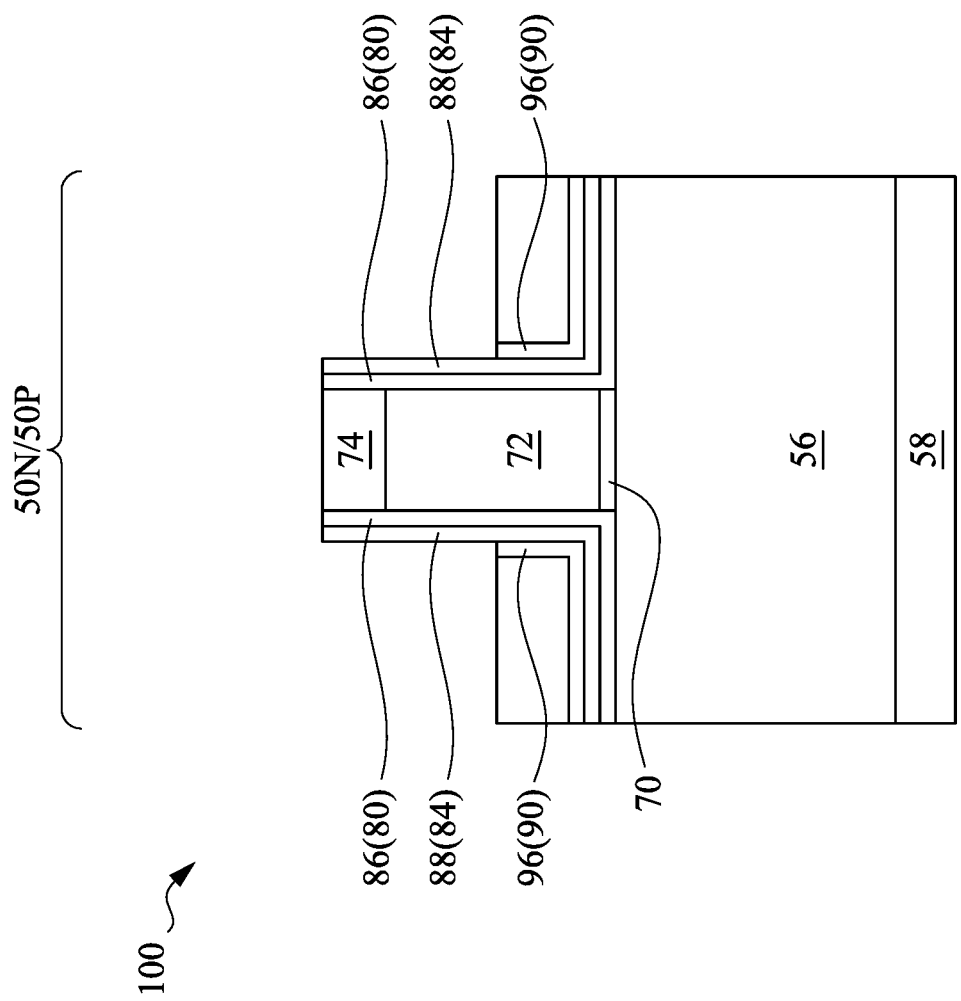
Figure 8C:
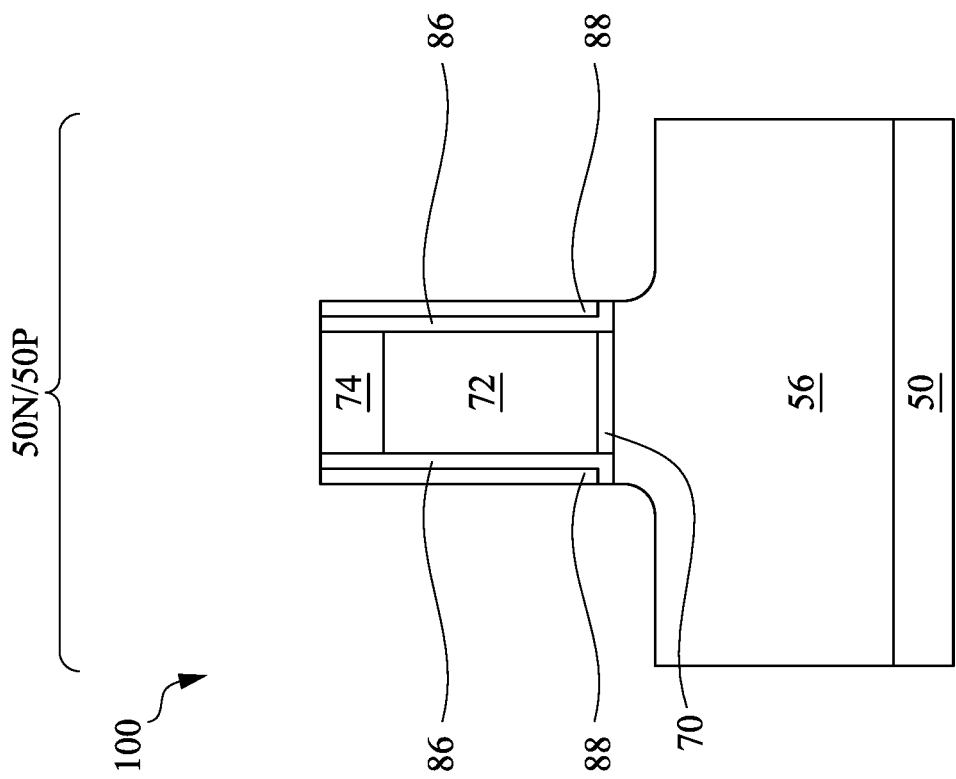
Figure 8B:
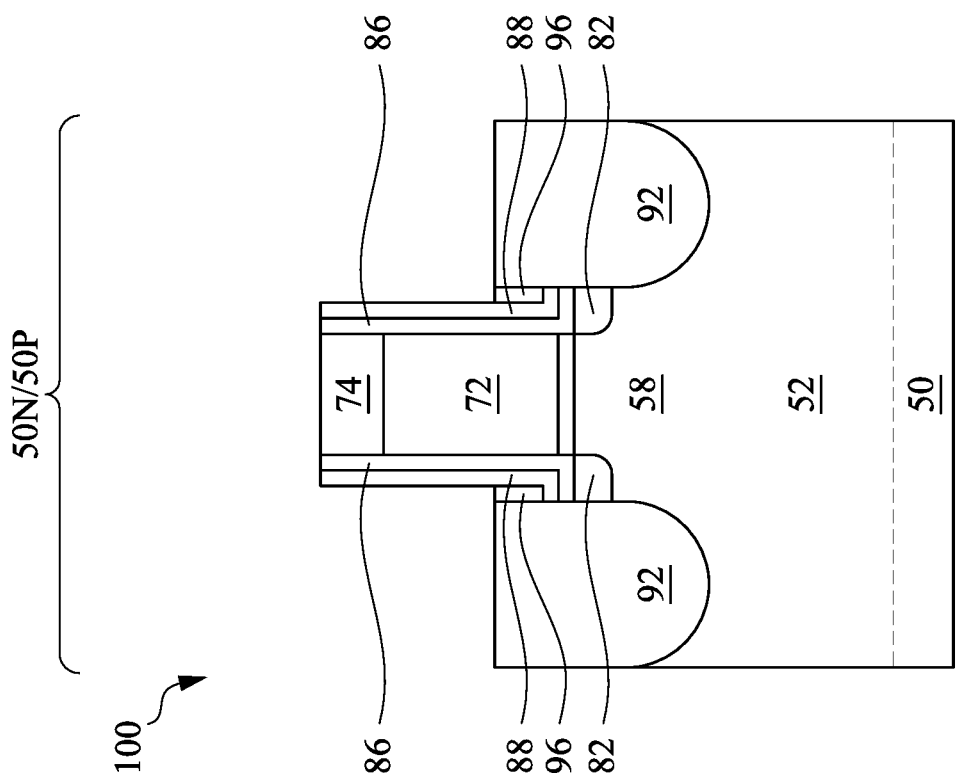
Figure 8E:
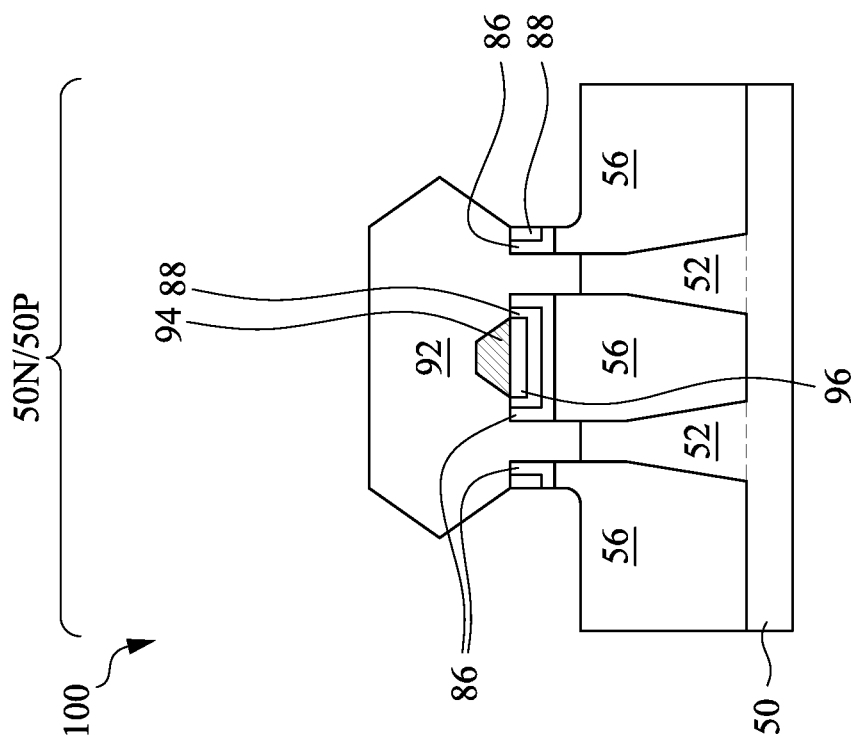
Figure 8D:
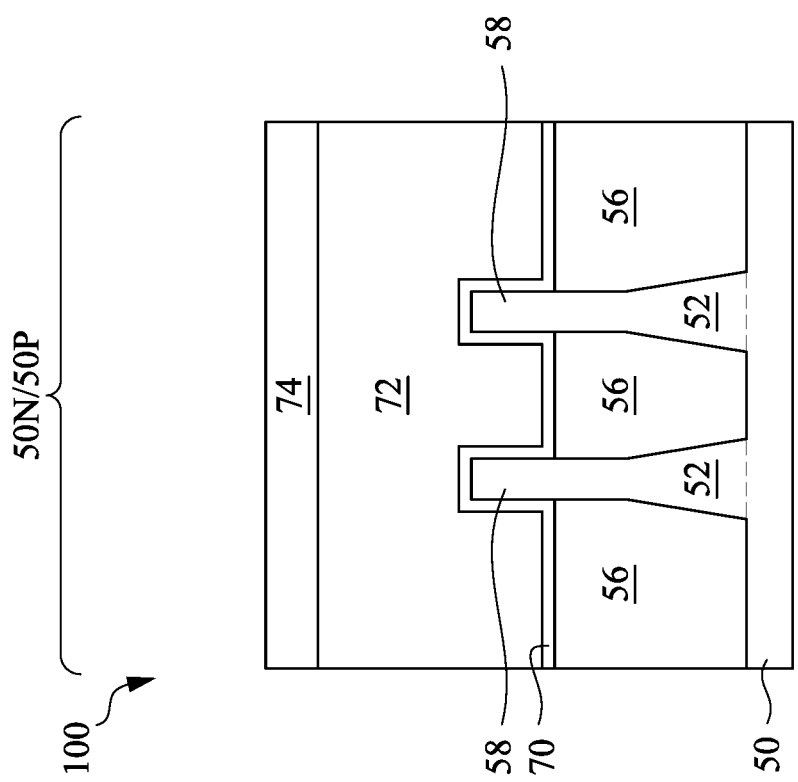
Figure 9A:
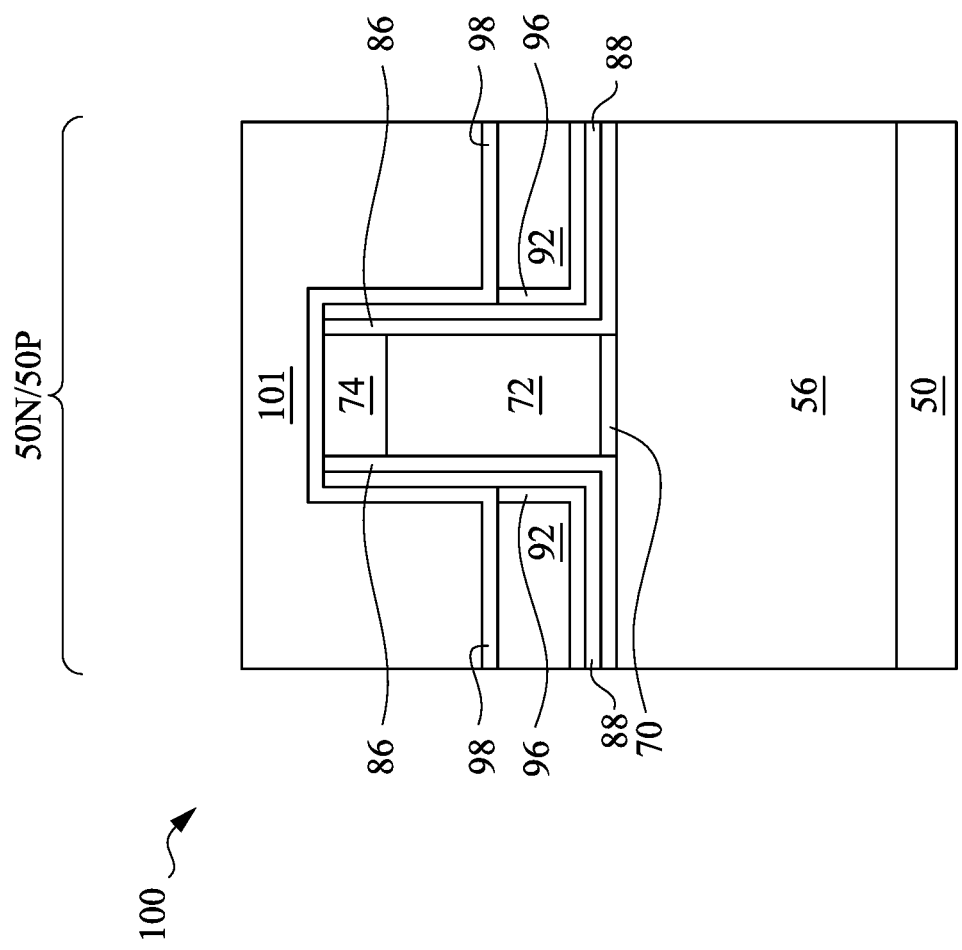
Figure 9C:
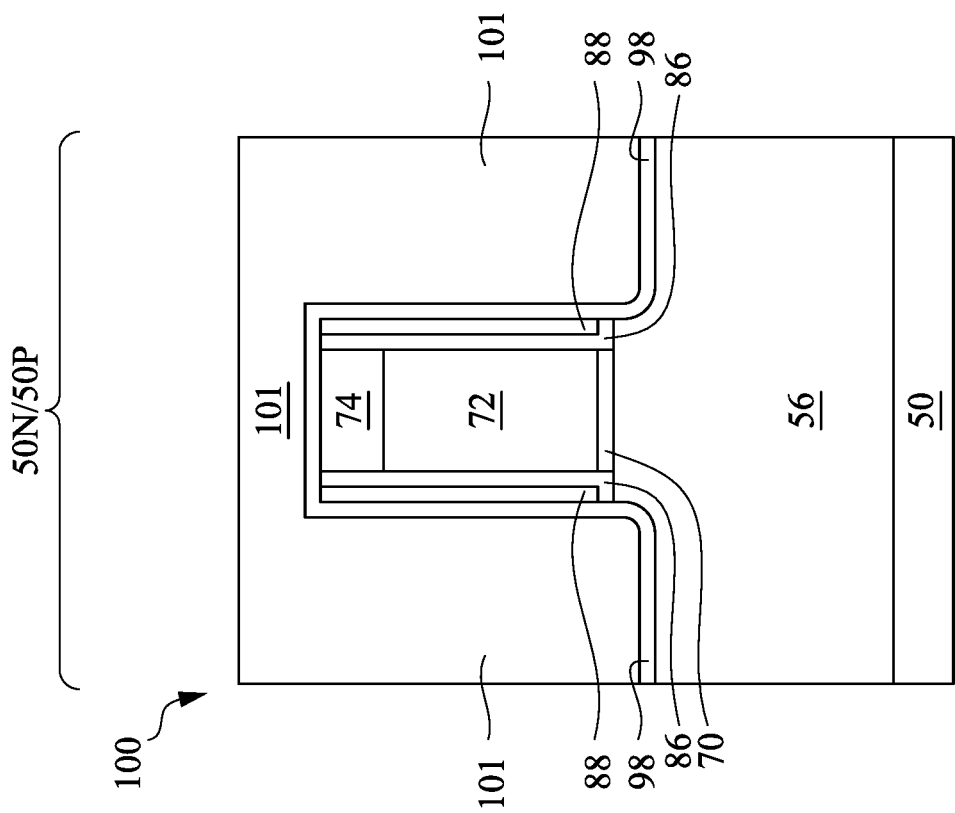
Figure 9B:
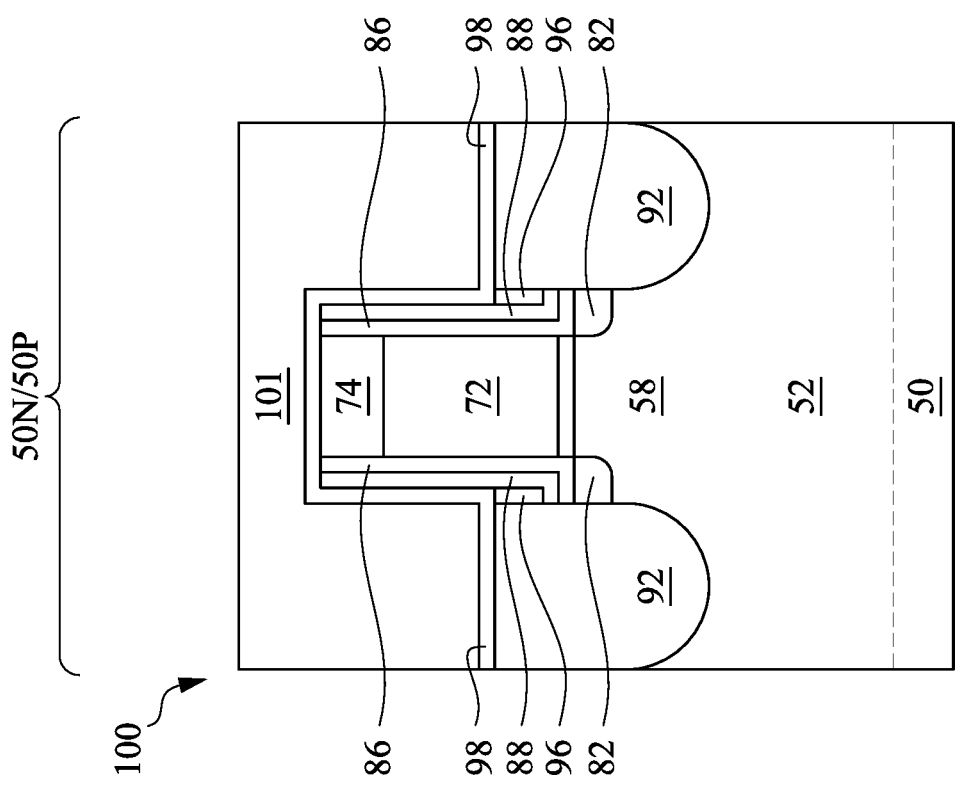
Figure 10A:
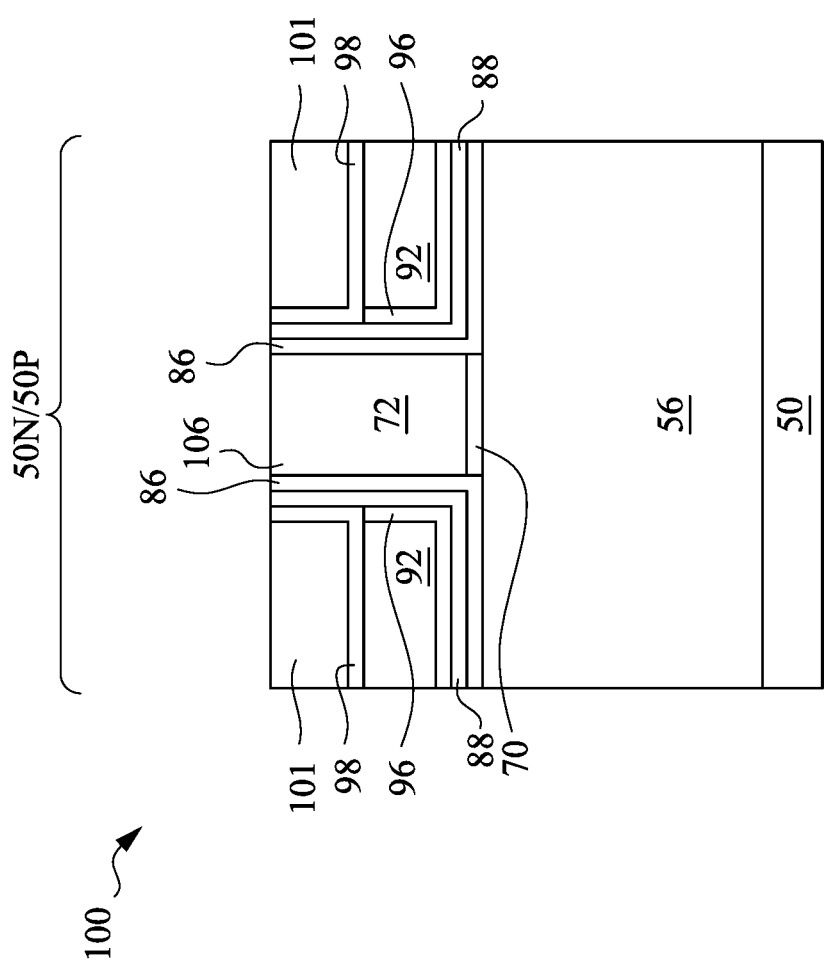
Figure 10C:
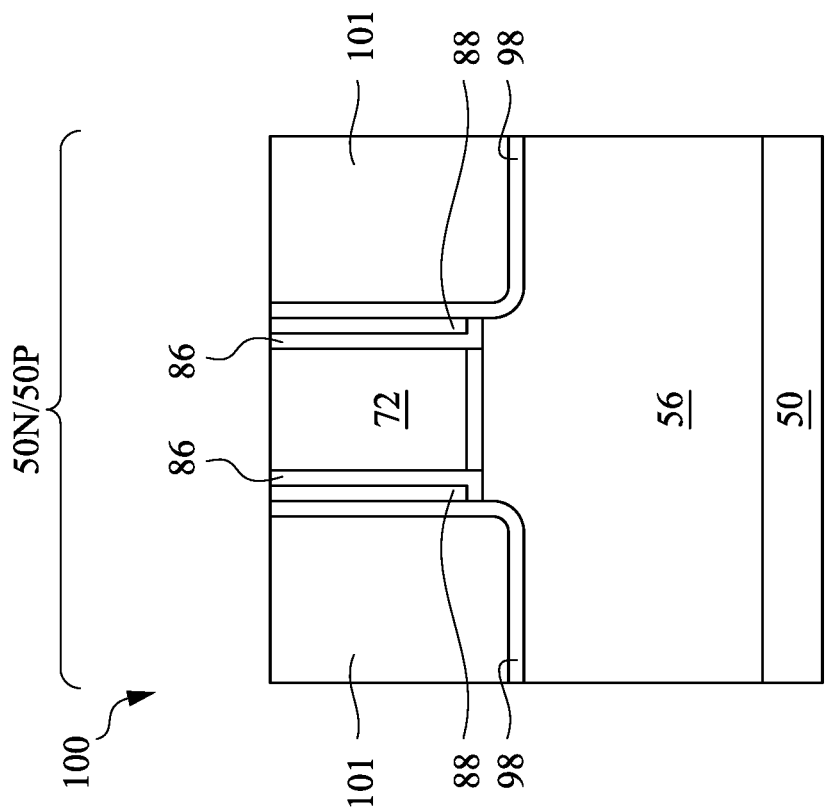
Figure 10B:
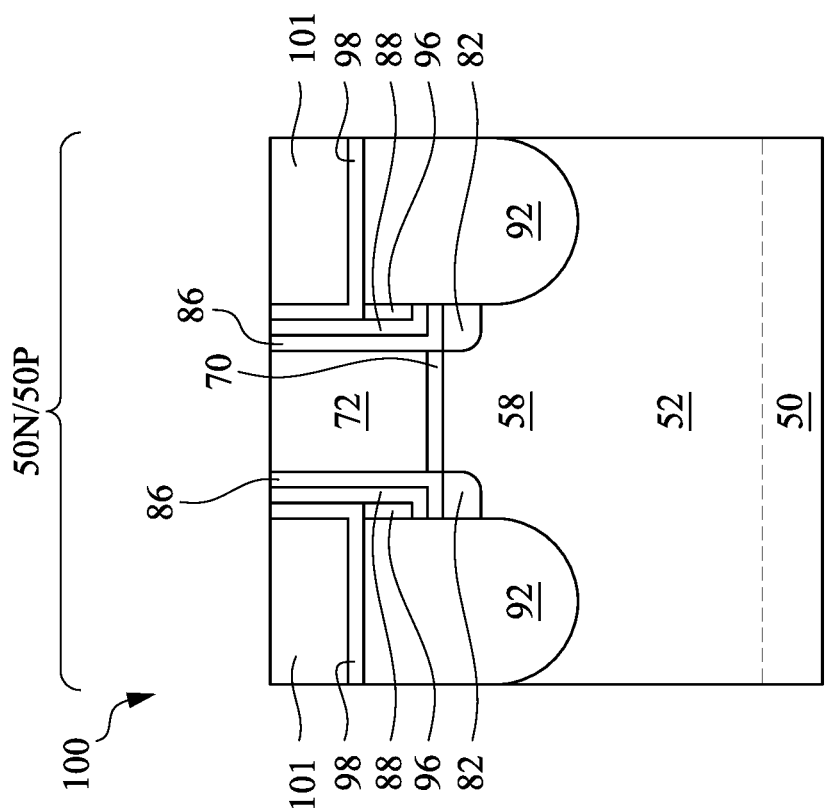
Figure 10E:
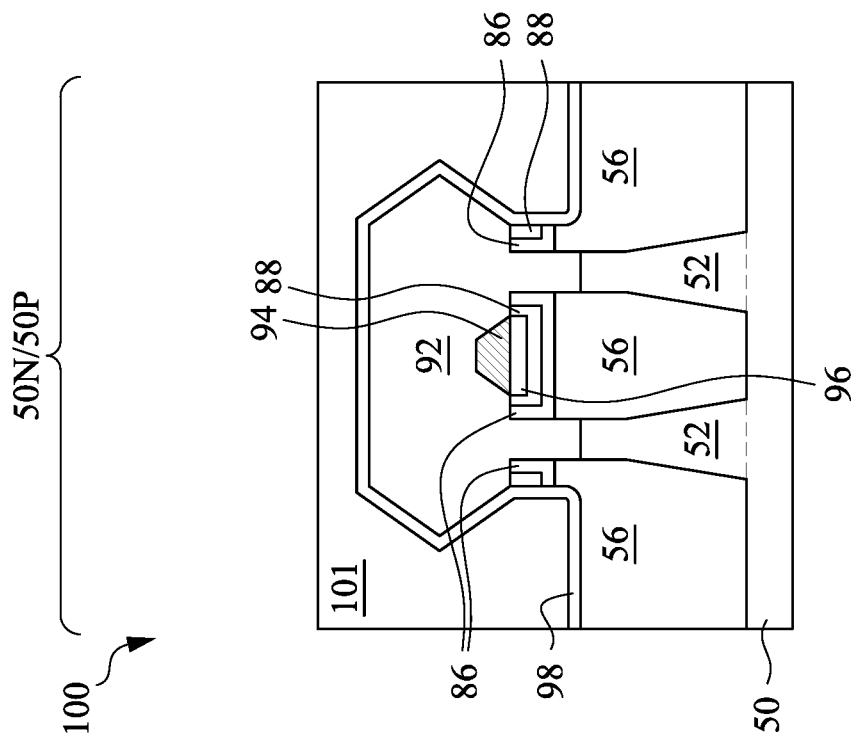
Figure 10D:
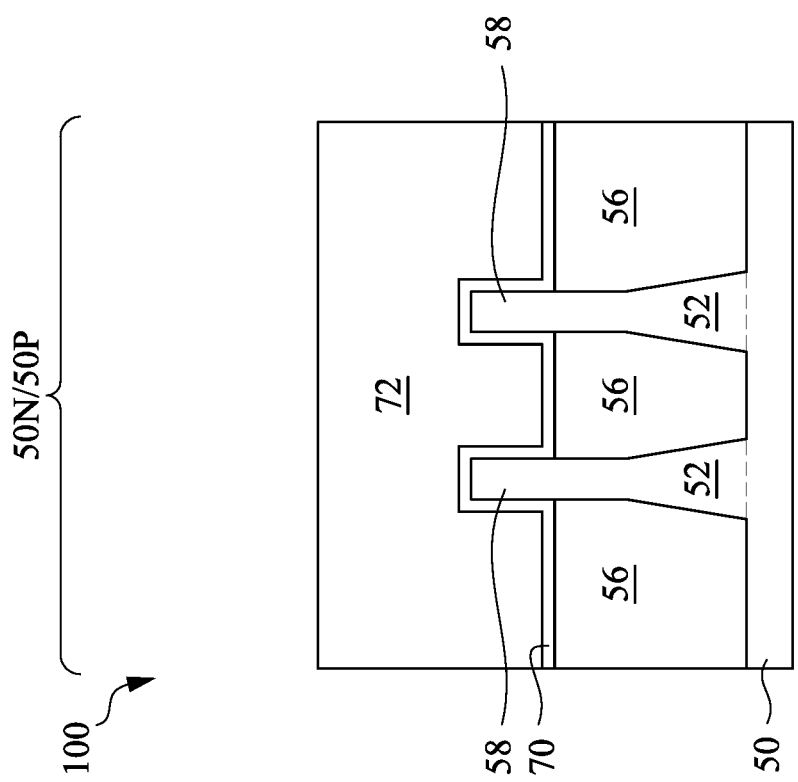
Figure 11A:
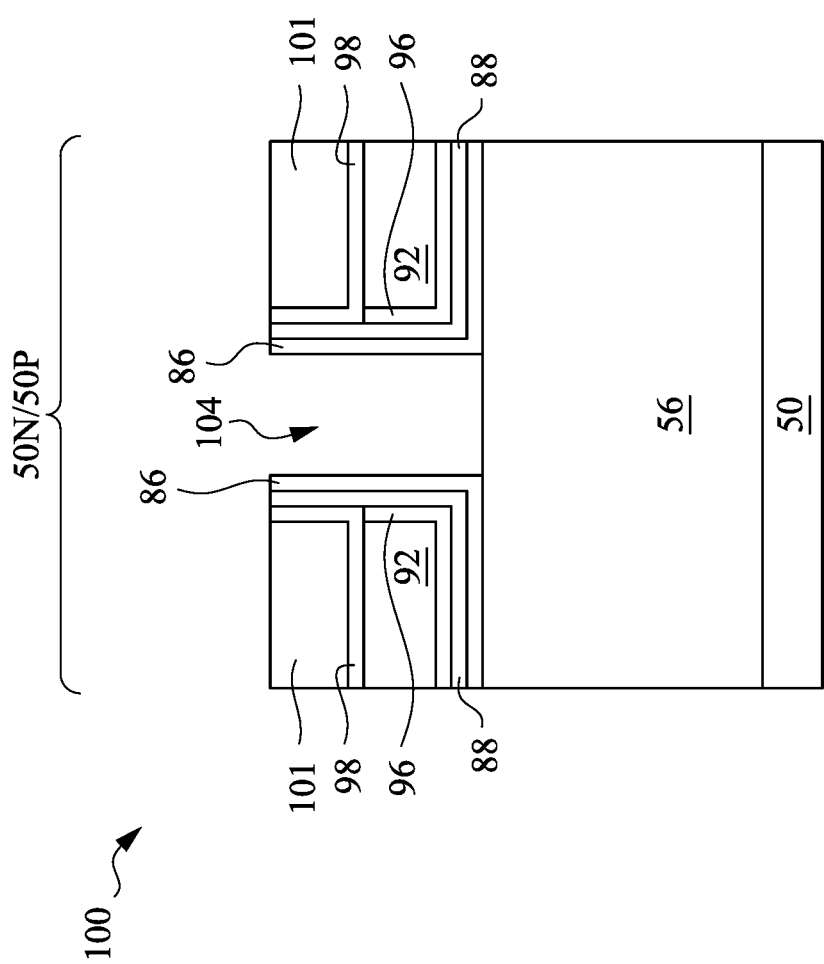
Figure 11C:
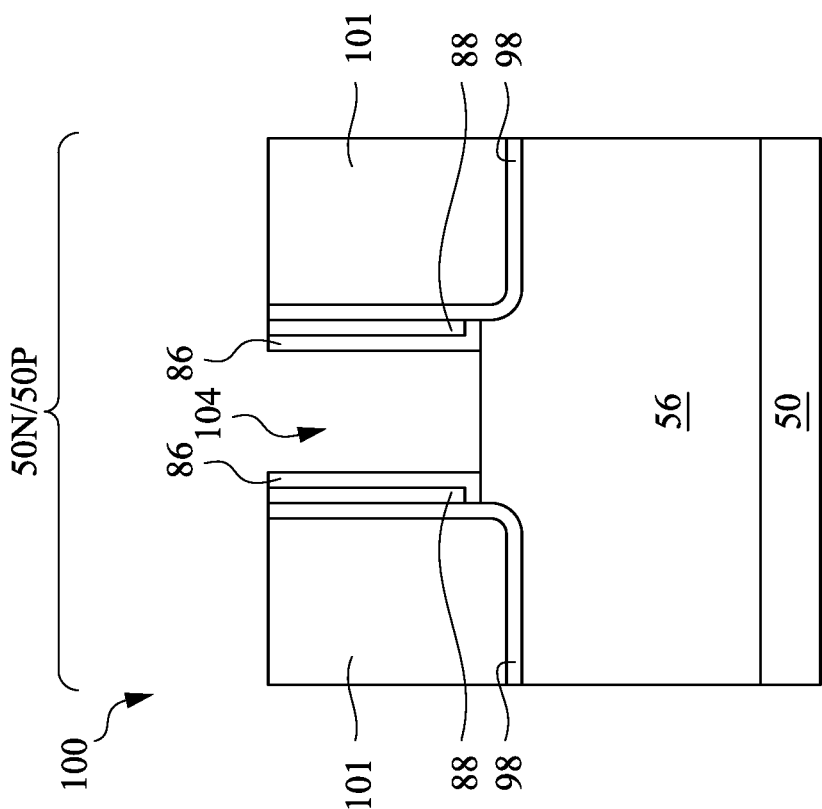
Figure 11B:
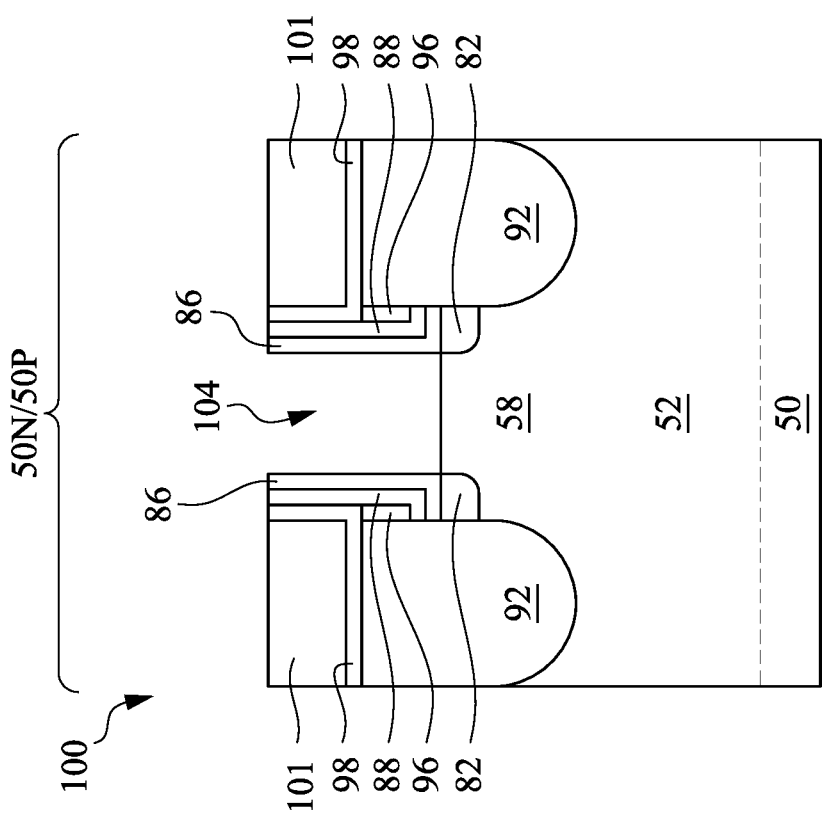
Figure 11E:
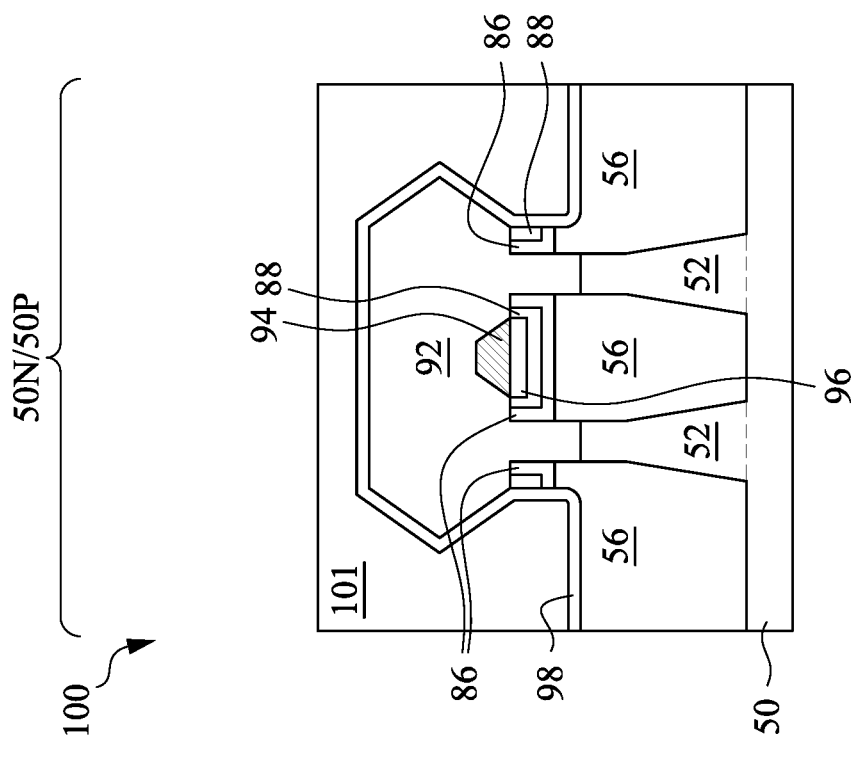
Figure 11D:
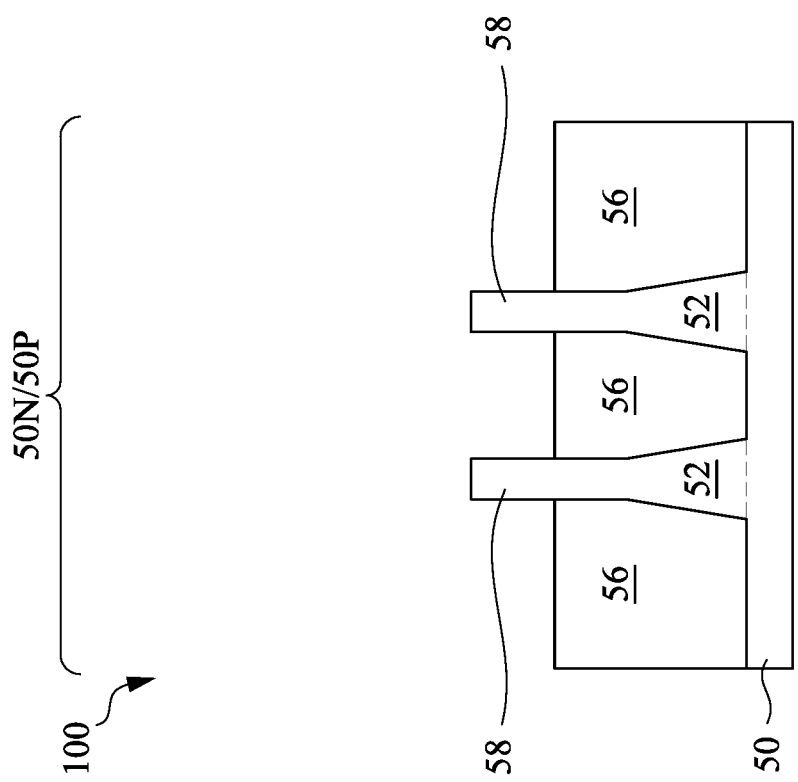

In FIG. 6, the mask layer 64 is patterned using acceptable photolithography and etching techniques to form masks 74. The pattern of the masks 74 is then transferred to the dummy gate layer 62 by an acceptable etching technique to form dummy gates 72. The pattern of the masks 74 is further transferred to the dummy dielectric layer 60 to form dummy gate dielectrics 70. The dummy gates 72 cover respective channel regions of the fins 52. The dummy gate dielectrics 70 and the dummy gates 72 may sometimes be collectively referred to as a "dummy gate stack." The pattern of the masks 74 may be used to physically separate each of the dummy gates 72 from adjacent dummy gates. The dummy gates 72 may also have a lengthwise direction substantially perpendicular to the lengthwise direction of respective epitaxial fins 52.

FIGS. 7A through 15E are cross-sectional views of further intermediate stages in manufacturing the FinFETs 10, in accordance with some embodiments. FIGS. 7A through 15E illustrate features in either of the region 50N and the region 50P. For example, the structures illustrated may be applicable to both the region 50N and the region 50P. Differences (if any) in the structures of the region 50N and the region 50P are described in the text accompanying each figure. In brief overview, FIGS. 7A, 8A, 9A, 10A, 11A, 12A, 13A, 14A, and 15A are illustrated along reference cross-section A-A illustrated in FIG. 1; FIGS. 7B, 8B, 9B, 10B, 11B, 12B, 13B, 14B, and 15B are illustrated along reference cross-section B-B illustrated in FIG. 1; FIGS. 7C, 8C, 9C, 10C, 11C, 12C, 13C, 14C, and 15C are illustrated along reference cross-section C-C illustrated in FIG. 1; FIGS. 7D, 8D, 9D, 10D, 11D, 12D, 13D, 14D, and 15D are illustrated along reference cross-section D-D illustrated in FIG. 1; and FIGS. 7E, 8E, 9E, 10E, 11E, 12E, 13E, 14E, and 15E are illustrated along reference cross-section E-E illustrated in FIG. 1.

In FIGS. 7A-E, a first gate spacer layer 80 is formed on exposed surfaces of the masks 74, dummy gates 72, dummy gate dielectrics 70, STI regions 56, and/or fins 52. The first gate spacer layer 80 is formed from a dielectric material such as silicon nitride, silicon carbonitride, silicon oxycarbonitride, silicon oxycarbide, silicon, metal oxides, the like, or a combination thereof, and may be formed by a conformal deposition process such as CVD, PECVD, or the like.

After forming the first gate spacer layer 80, implants for lightly doped source/drain (LDD) regions 82 are performed. In the embodiments with different device types, a mask, such as a photoresist, may be formed over the region 50N, while exposing the region 50P, and appropriate type (e.g., p-type) impurities may be implanted into the exposed fins 52 in the region 50P. The mask may then be removed. Subsequently, a mask, such as a photoresist, may be formed over the region 50P while exposing the region 50N, and appropriate type impurities (e.g., n-type) may be implanted into the exposed fins 52 in the region 50N. The mask may then be removed. The n-type impurities may be the any of the n-type impurities previously discussed, and the p-type impurities may be the any of the p-type impurities previously discussed. The lightly doped source/drain regions may have a concentration of impurities of from about 1015 cm$^{-3}$ to about 1016 cm$^{-3}$. An anneal may be used to activate the implanted impurities.

After forming the LDD regions 82, a second gate spacer layer 84 is formed on the first gate spacer layer 80. The second gate spacer layer 84 is formed from a semiconductor material such as $Si_{1-x}Ge_x$ that includes less than 50% (x<0.5) Ge in molar ratio. For example, Ge may comprise about 10% to 40% of the second gate spacer layer 84 of $Si_{1-x}Ge_x$ in molar ratio. The second gate spacer layer 84 may be formed by a conformal deposition process such as Molecular-Beam Deposition (MBD), ALD, PECVD, and the like. The second gate spacer layer 84 is doped, and may be doped with n-type impurities (e.g., phosphorous) or p-type impurities (e.g., boron). As shown, the second gate spacer layer 84 is a different material than the first gate spacer layer 80. The second gate spacer layer 84 and first gate spacer layer 80 have high etch selectivity relative a same etching process, e.g., the etch rate of the second gate spacer layer 84 is greater than the etch rate of the first gate spacer layer 80 during a same etching process. In some embodiments, the second gate spacer layer 84 may be doped in subsequent processing, thereby further increasing the etch selectivity between the second gate spacer layer 84 and first gate spacer layer 80, which will be discussed in further detail below.

After forming the second gate spacer layer 84, a third gate spacer layer 90 is formed on the second gate spacer layer 84. The third gate spacer layer 90 is formed from a dielectric material selected from the candidate dielectric materials of the first gate spacer layer 80, and may be formed by a method selected from the candidate methods of forming the first gate spacer layer 80, or may be formed by a different method. In some other embodiments, the third gate spacer layer 90 is formed of a different material than the first gate spacer layer 80. In particular, the third gate spacer layer 90 can have a high etch selectivity with the first gate spacer layer 80. As will be discussed further below, the third gate spacer layer 90 is also doped in subsequent processing, which further increases the etch selectivity between the third gate spacer layer 90 and first gate spacer layer 80.

In FIGS. 8A-E, epitaxial source/drain regions 92 are formed in the fins 52 to exert stress in the respective channel regions 58, thereby improving performance. The epitaxial source/drain regions 92 are formed in the fins 52 such that each dummy gate 72 is disposed between respective neighboring pairs of the epitaxial source/drain regions 92. In some embodiments the epitaxial source/drain regions 92 may extend into, and may also penetrate through, the fins 52. The first gate spacer layer 80, second gate spacer layer 84, and third gate spacer layer 90 are used to separate the epitaxial source/drain regions 92 from the dummy gates 72 by an appropriate lateral distance so that the epitaxial source/drain regions 92 do not short out subsequently formed gates of the resulting FinFETs.

The epitaxial source/drain regions 92 in the region 50N, e.g., the NMOS region, may be formed by masking the region 50P, e.g., the PMOS region, and etching source/drain regions of the fins 52 in the region 50N to form recesses in the fins 52. Then, the epitaxial source/drain regions 92 in the region 50N are epitaxially grown in the recesses. The epitaxial source/drain regions 92 may include any acceptable material, such as appropriate for n-type FinFETs. For example, if the fin 52 is silicon, the epitaxial source/drain regions 92 in the region 50N may include materials exerting a tensile strain in the channel region 58, such as silicon, SiC, SiCP, SiP, or the like. The epitaxial source/drain regions 92 in the region 50N may have surfaces raised from respective surfaces of the fins 52 and may have facets.

The epitaxial source/drain regions 92 in the region 50P, e.g., the PMOS region, may be formed by masking the region 50N, e.g., the NMOS region, and etching source/drain regions of the fins 52 in the region 50P to form recesses in the fins 52. Then, the epitaxial source/drain regions 92 in the region 50P are epitaxially grown in the recesses. The epitaxial source/drain regions 92 may include any acceptable material, such as appropriate for p-type FinFETs. For example, if the fin 52 is silicon, the epitaxial source/drain regions 92 in the region 50P may comprise materials exerting a compressive strain in the channel region 58, such as SiGe, SiGeB, Ge, GeSn, or the like. The epitaxial source/drain regions 92 in the region 50P may also have surfaces raised from respective surfaces of the fins 52 and may have facets.

In some embodiments, the third gate spacer layer 90 is formed prior to the process for forming the epitaxial source/drain regions 92, and a third gate spacer layer 90 may be formed in each region. For example, a third gate spacer layer 90 may be formed with the epitaxial source/drain regions 92 in the region 50N, while the region 50P is masked, and a third gate spacer layer 90 may be formed with the epitaxial source/drain regions 92 in the region 50P, while the region 50N is masked. The third gate spacer layer 90 acts as an additional etching mask during the recessing of the source/drain regions of the fins 52, protecting vertical portions of the second gate spacer layer 84 during the etching of the source/drain regions of the fins 52. The source/drain recesses may thus be formed to a greater depth and narrower width.

During the recessing of the source/drain regions of the fins 52, the first gate spacer layer 80, second gate spacer layer 84, and third gate spacer layer 90 are etched. Openings are formed in the first gate spacer layer 80, second gate spacer layer 84, and third gate spacer layer 90, exposing the source/drain regions of the fins 52, and the openings are extended into the fins 52 to form the recesses for the epitaxial source/drain regions 92. The etching may be, e.g., an anisotropic etching, such as a dry etch. The first gate spacer layer 80, second gate spacer layer 84, and third gate spacer layer 90 may (or may not) be etched in different processes.

The epitaxial source/drain regions 92 and/or the fins 52 may be implanted with dopants to form source/drain regions, similar to the process previously discussed for forming lightly-doped source/drain regions, followed by an anneal. The source/drain regions may have an impurity concentration of between about $10^{19}$ cm$^{-3}$ and about $10^{21}$ cm$^{-3}$. The n-type and/or p-type impurities for source/drain regions may be any of the impurities previously discussed. In some embodiments, the epitaxial source/drain regions 92 may be in situ doped during growth.

As a result of the epitaxy processes used to form the epitaxial source/drain regions 92 in the region 50N and the region 50P, upper surfaces of the epitaxial source/drain regions have facets which expand laterally outward beyond sidewalls of the fins 52. In some embodiments, these facets cause adjacent epitaxial source/drain regions 92 of a same FinFET to merge as illustrated. Voids 94 may be formed beneath the merged epitaxial source/drain regions 92, between adjacent fins 52, as better illustrated in FIG. 8E. Two or more adjacent regions may merge. In other embodiments (discussed further below), adjacent epitaxial source/drain regions 92 remain separated after the epitaxy process is completed. In the cross-sectional view cut on the isolation regions 56 and between the fins 52 (e.g., FIG. 8A, and FIGS. 9A, 10A, 11A, 12A, 13A, 14A, and 15A), remaining portions of the third gate spacer layer 90 are shown as being observable, e.g., extending along (in physical contact with) a bottom surface and at least one sidewall of each of the source/drain regions 92. However, it should be understood that such remaining portions of the third gate spacer layer 90 may be etched, e.g., forming portions of the voids 94, while remaining within the scope of the present disclosure.

During doping of the epitaxial source/drain regions 92, the first gate spacer layer 80, second gate spacer layer 84, and third gate spacer layer 90 may also be doped. For example, when the doping is by implantation, some impurities may be implanted in the various spacers. Likewise, when the doping is performed in situ during growth, the various spacers may be exposed to the dopant precursors of the epitaxy process. Because the third gate spacer layer 90 covers the second gate spacer layer 84, the second gate spacer layer 84 may have a lower dopant concentration than the third gate spacer layer 90. Likewise, because the second gate spacer layer 84 covers the first gate spacer layer 80, the first gate spacer layer 80 may have a lower dopant concentration than the second gate spacer layer 84. Further, some regions (e.g., upper regions) of the first gate spacer layer 80, second gate spacer layer 84, and third gate spacer layer 90 may be doped to a higher impurity concentration than other regions (e.g., lower regions) of the spacer layers. Due to the masking steps discussed above, the first gate spacer layer 80, second gate spacer layer 84, and third gate spacer layer 90 in the region 50N are doped with the same impurities as the epitaxial source/drain regions 92 in the region 50N. Likewise, the first gate spacer layer 80, second gate spacer layer 84, and third gate spacer layer 90 in the region 50P are doped with the same impurities as the epitaxial source/drain regions 92 in the region 50P. As such, the conductivity type (e.g., majority carrier type) of each epitaxial source/drain region 92 is the same as the portions of the first gate spacer layer 80, second gate spacer layer 84, and third gate spacer layer 90 adjacent the epitaxial source/drain region 92.

After forming the epitaxial source/drain regions 92, remaining portions of the first gate spacer layer 80 and second gate spacer layer 84, respectively, form first gate spacers 86 and second gate spacers 88. Further, the third gate spacer layer 90 may be partially removed. The removal may be by an appropriate etching process, such as a wet etch using hot $H_3PO_4$ acid. In some embodiments, residual portions of the third gate spacer layer 90 remain after the removal, with the residual portions being disposed between the second gate spacers 88 and the raised surfaces of the epitaxial source/drain regions 92, and in the voids 94 of the epitaxial source/drain regions 92. The residual portions of the third gate spacer layer 90 are referred to as residual spacers 96.

In FIGS. 9A-E, a contact etch stop layer (CESL) 98 is formed along the second gate spacers 88, and over the epitaxial source/drain regions 92 and residual spacers 96. The CESL 98 may be formed from a dielectric material selected from the candidate dielectric materials of the first gate spacer layer 80 (86), or may include a different dielectric material. The CESL 98 may be formed by a method selected from the candidate methods of forming the first gate spacer layer 80, or may be formed by a different method. As shown, the CESL 98 is a different dielectric material than the second gate spacer layer 84 (88). The second gate spacer layer 84 and CESL 98 have high etch selectivity relative a same etching process, e.g., the etch rate of the second gate spacer layer 84 is greater than the etch rate of the CESL 98 during the etching process. In some embodiments, the CESL 98 and first gate spacer layer 80 are formed from the same dielectric material.

Further, a first inter-layer dielectric (ILD) 101 is deposited over the CESL 98. The ILD 101 may be formed of a dielectric material, and may be deposited by any suitable method, such as CVD, plasma-enhanced CVD (PECVD), or FCVD. Dielectric materials may include Phospho-Silicate Glass (PSG), Boro-Silicate Glass (BSG), Boron-Doped Phospho-Silicate Glass (BPSG), undoped Silicate Glass (USG), or the like. Other insulation materials formed by any acceptable process may be used.

In FIGS. 10A-E, a planarization process, such as a chemical mechanical polishing (CMP), may be performed to level the top surface of the ILD 101 with the top surfaces of the dummy gates 72 or the masks 74. The planarization process removes portions of the CESL 98 over the masks 74, and may also remove the masks 74 on the dummy gates 72. After the planarization process, top surfaces of the dummy gates 72, first gate spacers 86, second gate spacers 88, CESL 98, and ILD 101 are level. Accordingly, the top surfaces of the dummy gates 72 are exposed through the ILD 101. In some embodiments, the masks 74 may remain, in which case the planarization process levels the top surface of the ILD 101 with the top surfaces of the masks 74.

In FIGS. 11A-E, the dummy gates 72, and the masks 74 if present, are removed in an etching step(s), so that recesses 104 are formed. The dummy gate dielectrics 70 in the recesses 104 may also be removed. In some embodiments, only the dummy gates 72 are removed and the dummy gate dielectrics 70 remain and are exposed by the recesses 104. In some embodiments, the dummy gate dielectrics 70 are removed from recesses 104 in a first region of a die (e.g., a core logic region) and remains in recesses 104 in a second region of the die (e.g., an input/output region). In some embodiments, the dummy gates 72 are removed by an anisotropic dry etch process. For example, the etching process may include a dry etch process using reaction gas(es) that selectively etch the dummy gates 72 without etching the first gate spacers 86, second gate spacers 88, CESL 98, or ILD 101. Each recess 104 exposes a channel region 58 of a respective fin 52. Each channel region 58 is disposed between neighboring pairs of the epitaxial source/drain regions 92. During the removal, the dummy gate dielectrics 70 may be used as etch stop layers when the dummy gates 72 are etched. The dummy gate dielectrics 70 may then be optionally removed after the removal of the dummy gates 72.

Figure 12A:
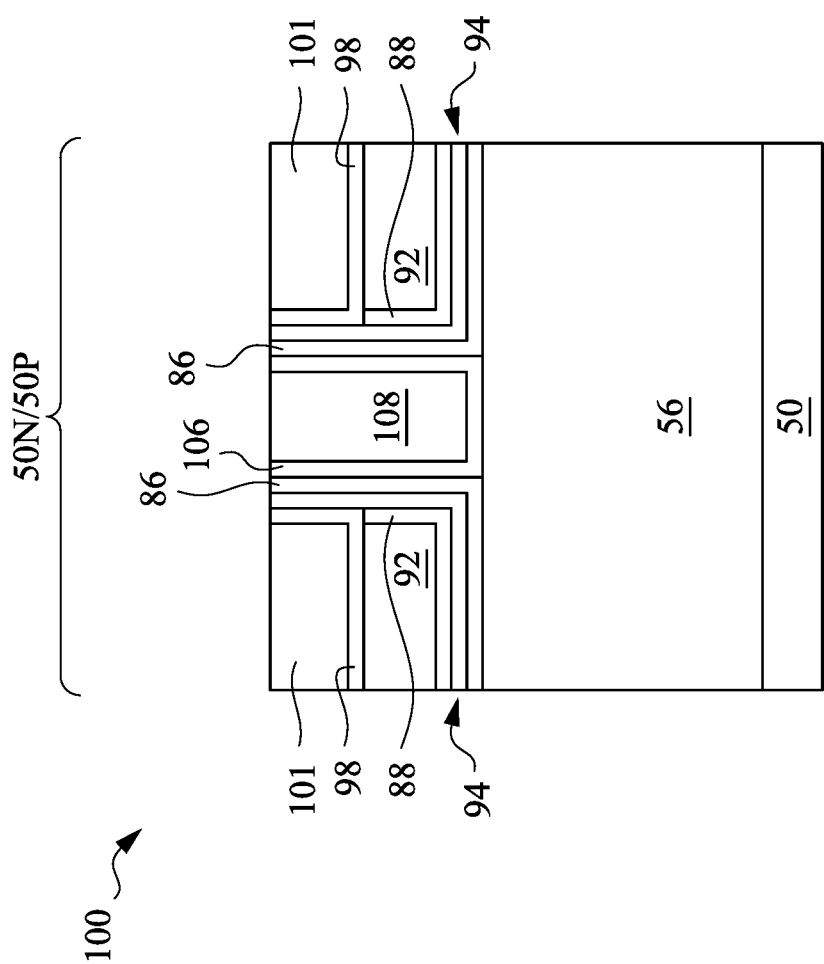
Figure 12C:
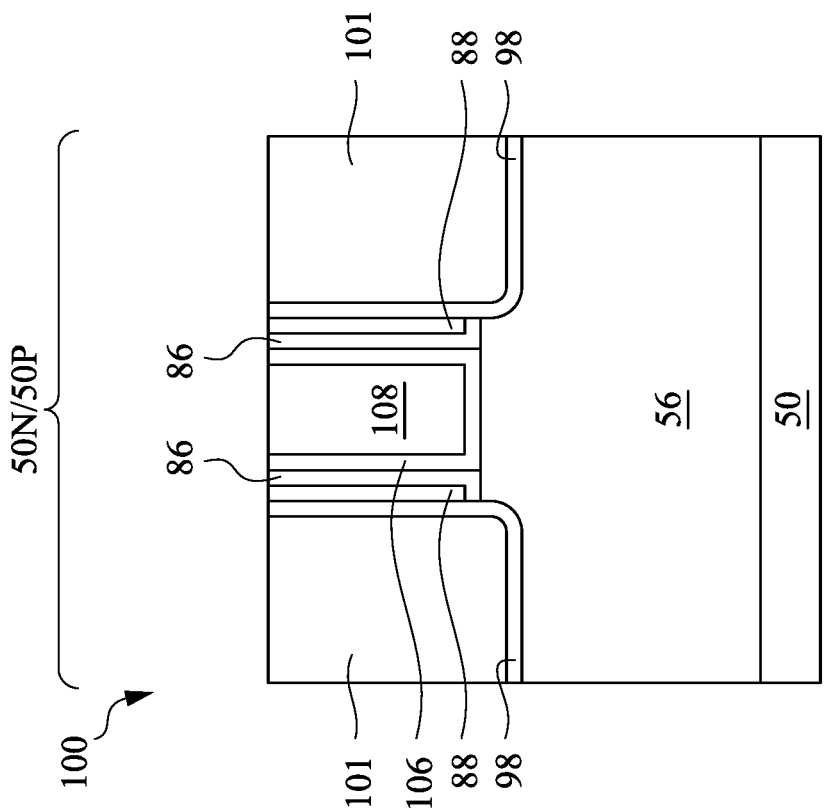
Figure 12B:
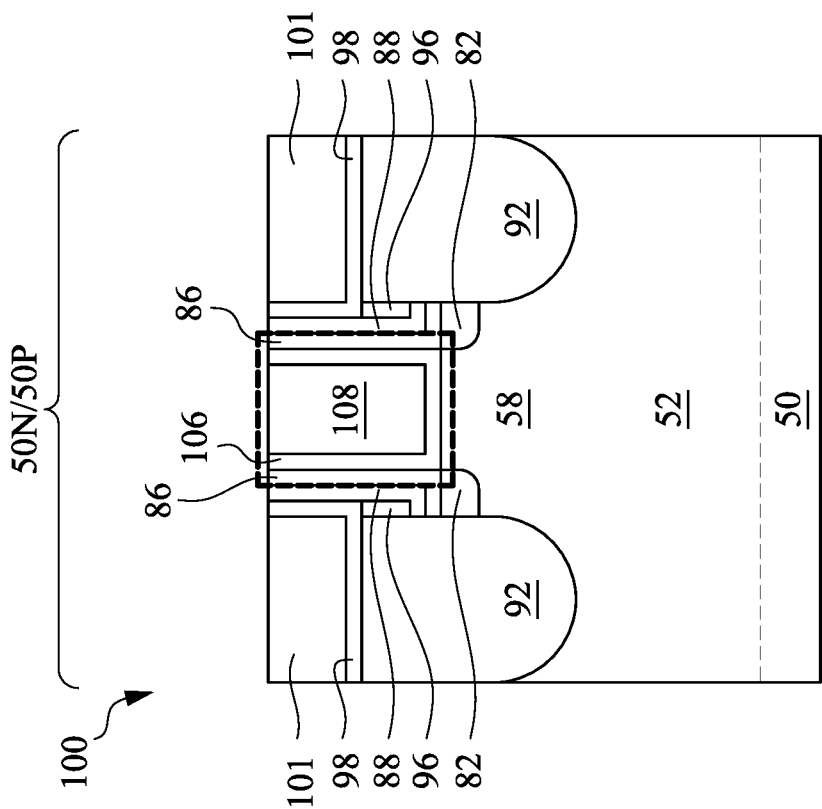
Figure 12E:
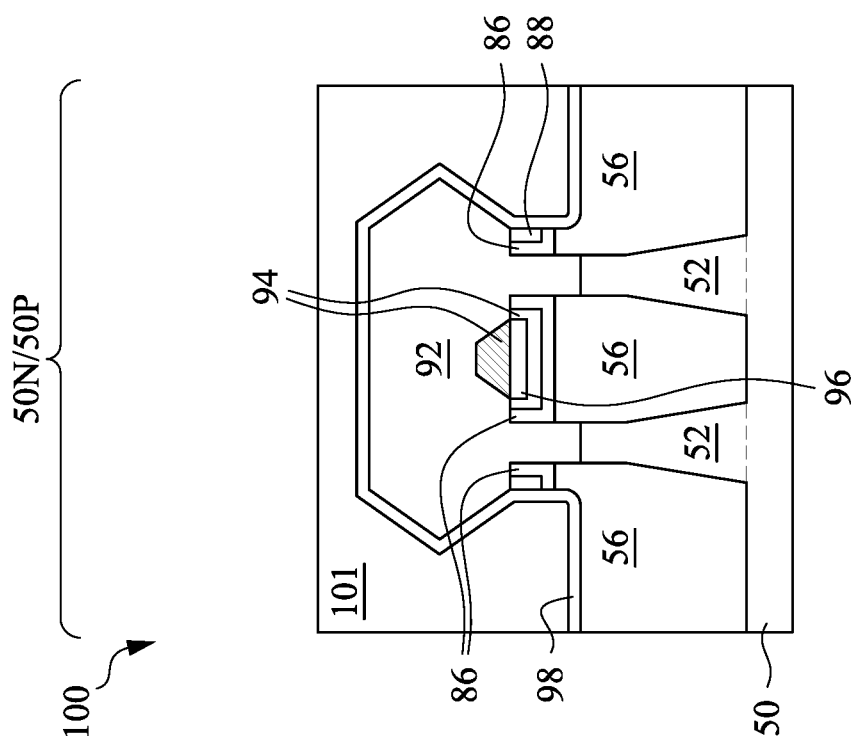
Figure 12D:
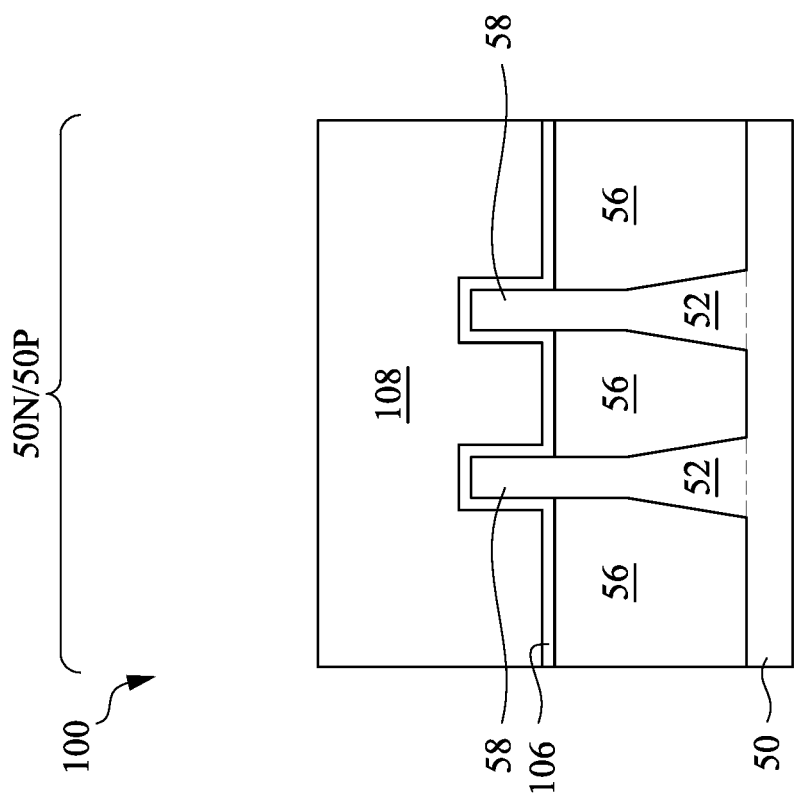
Figure 12F:
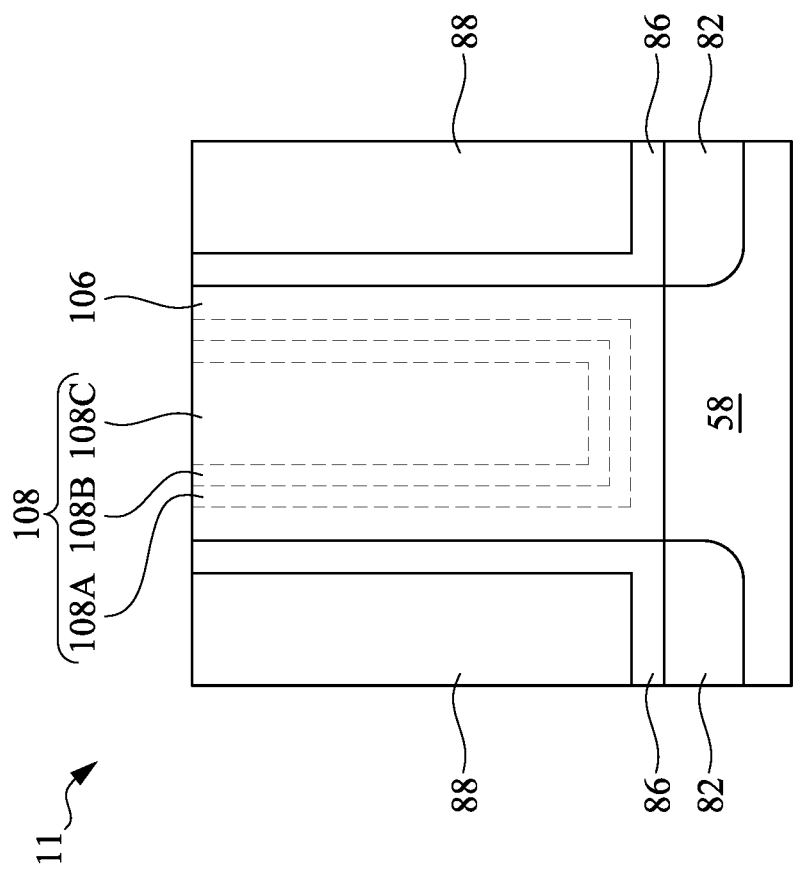
Figure 13A:
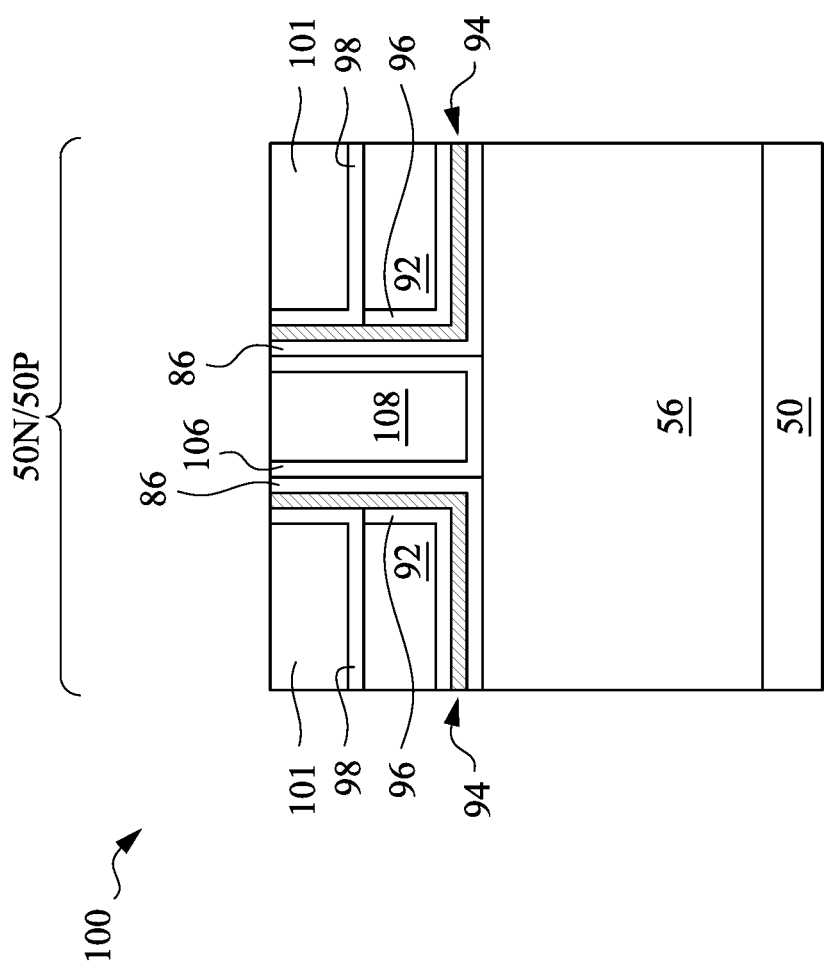
Figure 13C:
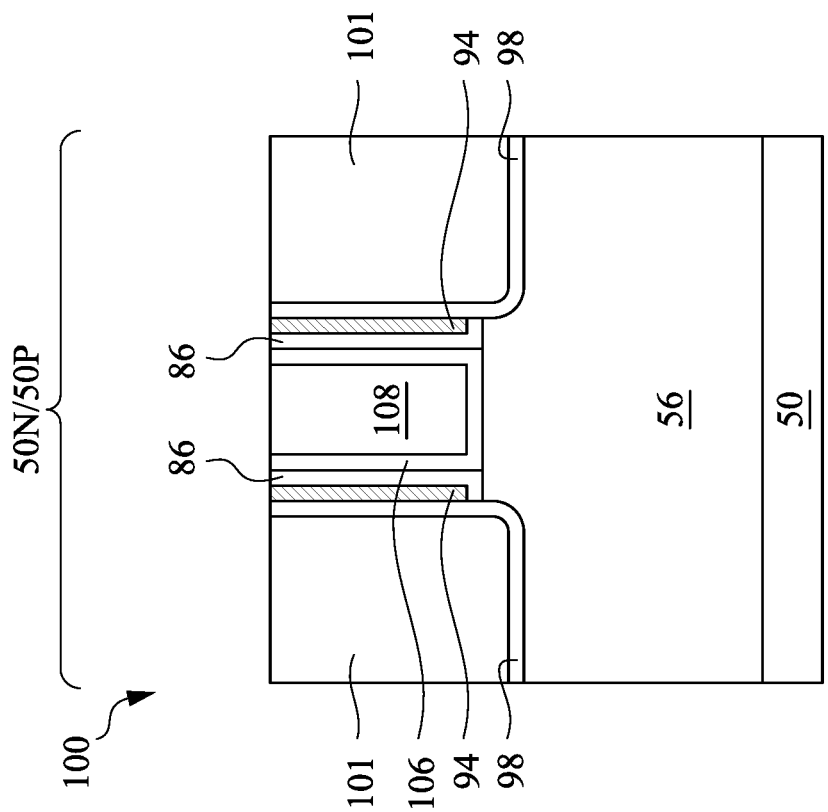
Figure 13B:
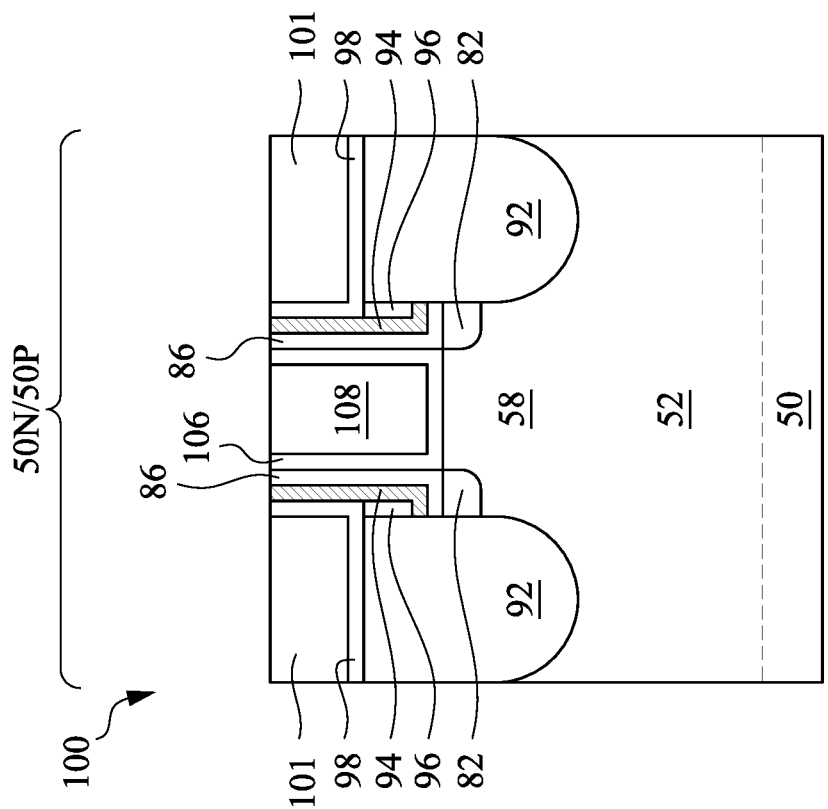
Figure 13E:
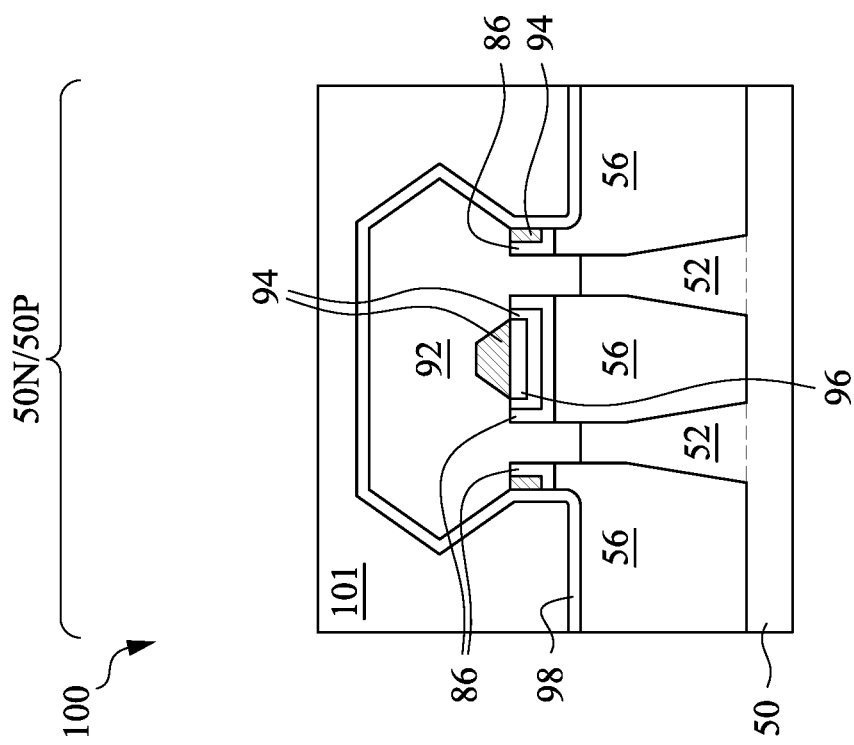
Figure 13D:
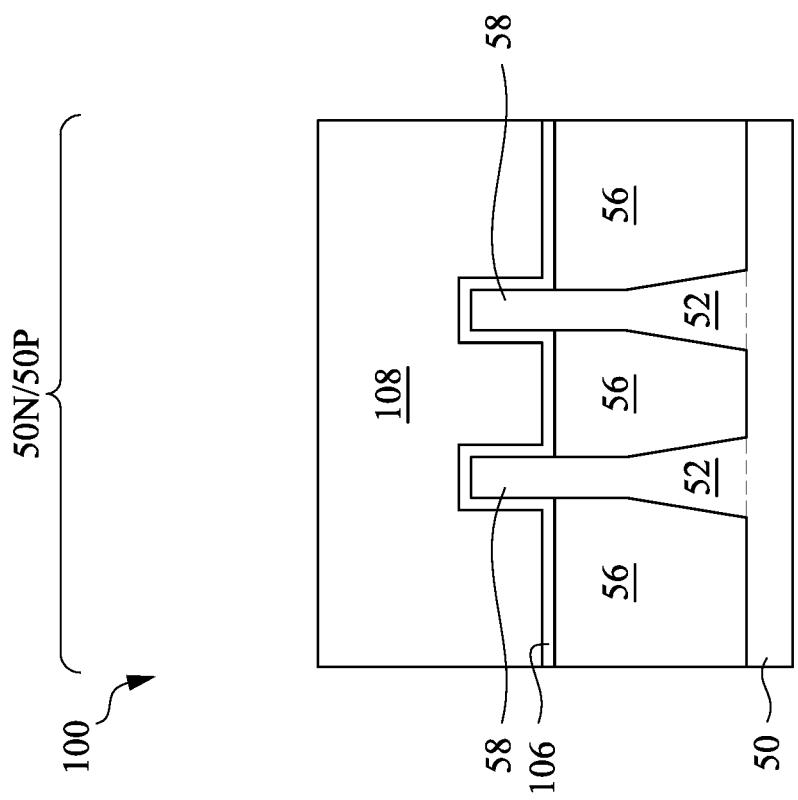
Figure 14A:
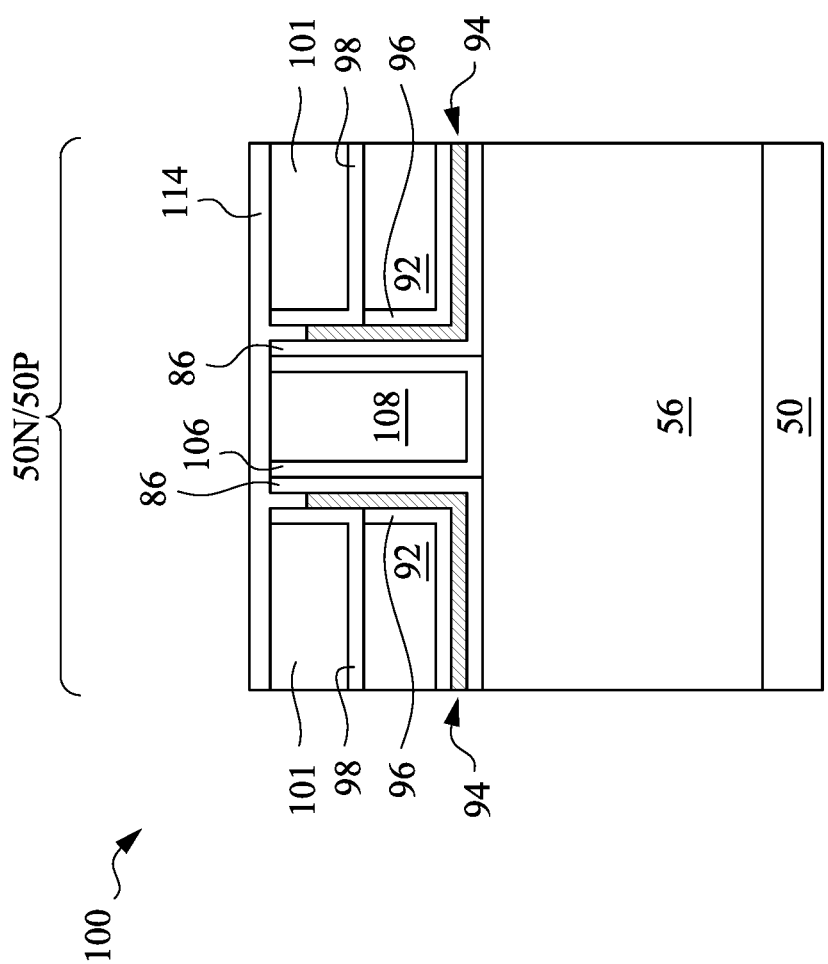
Figure 14C:
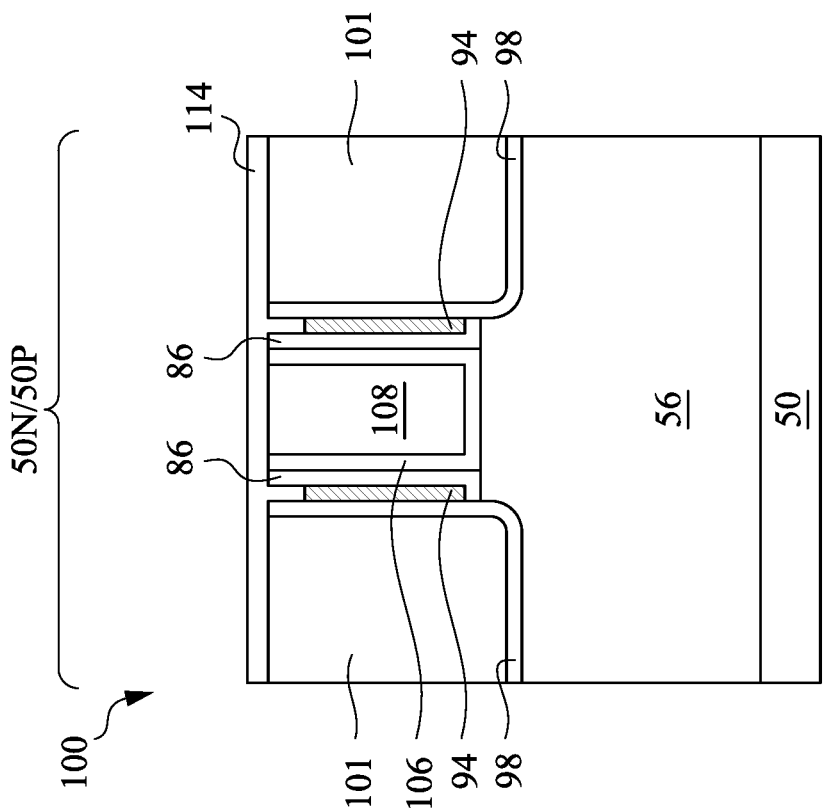
Figure 14B:
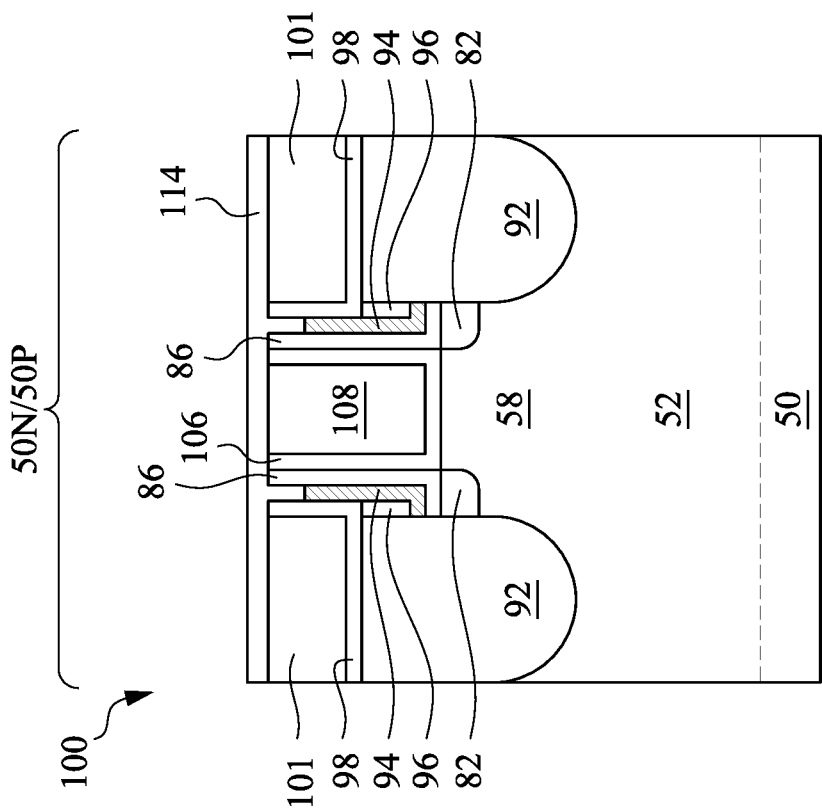
Figure 14E:
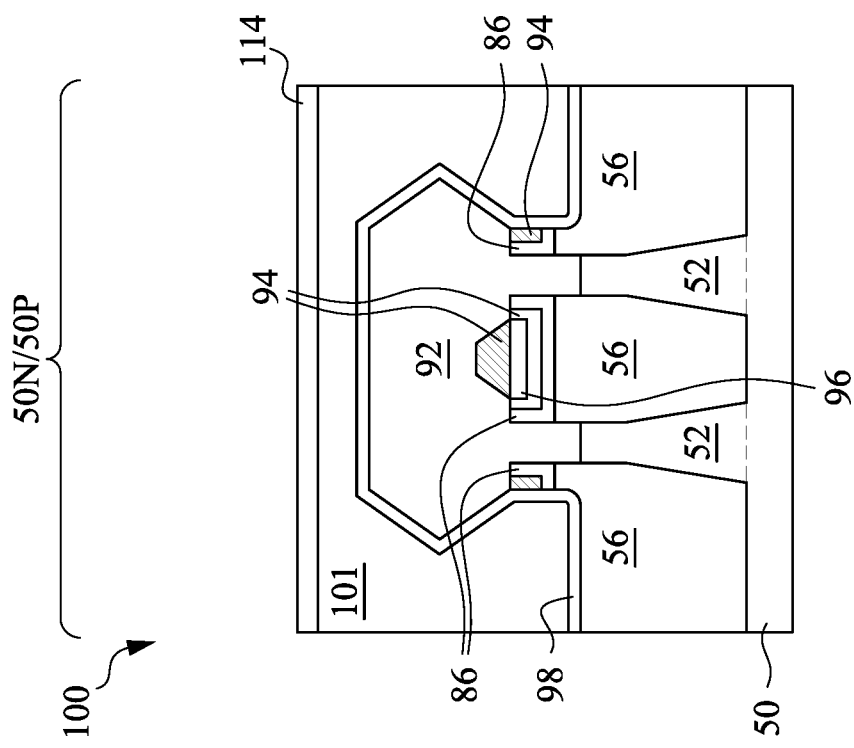
Figure 14D:
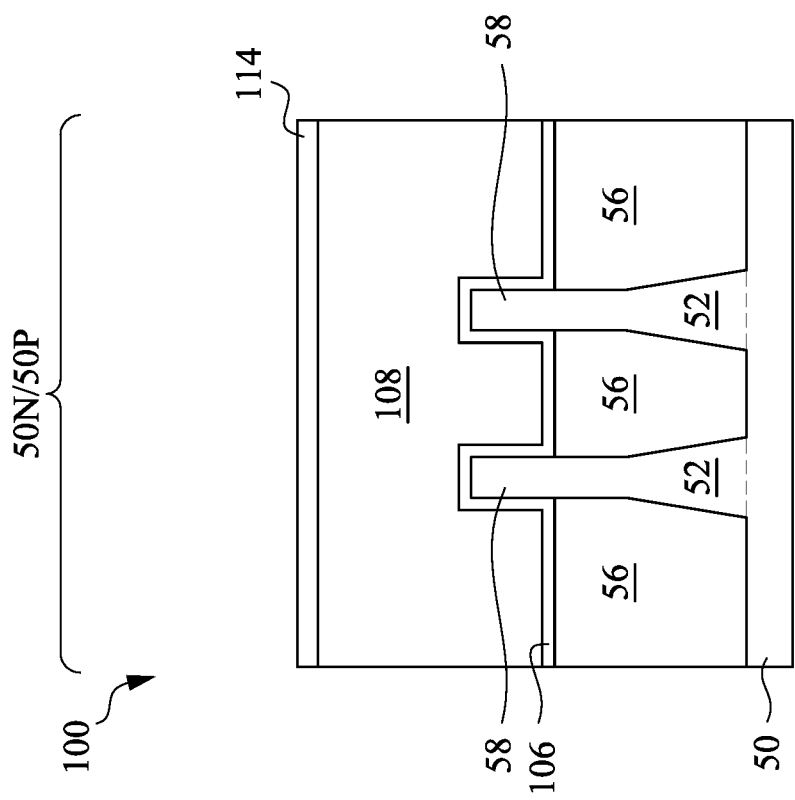
Figure 15C:
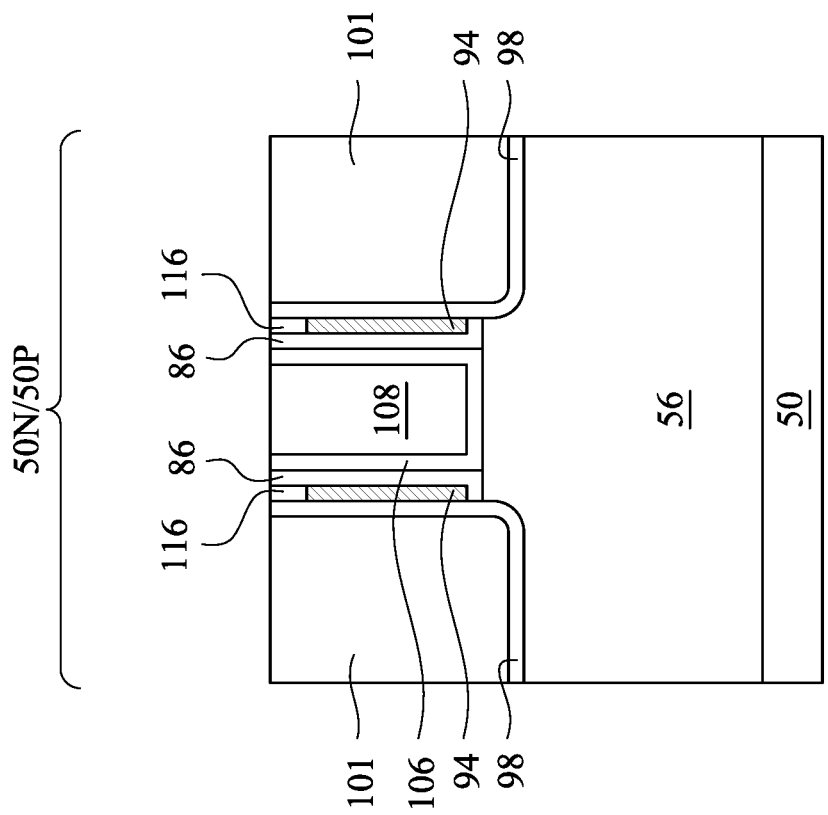
Figure 15B:
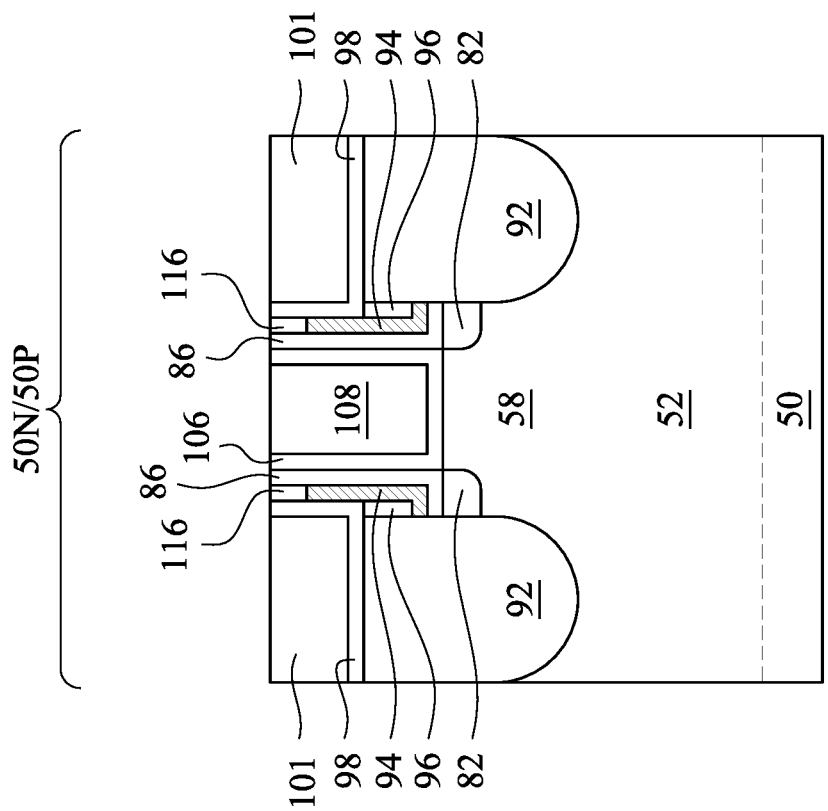
Figure 15E:
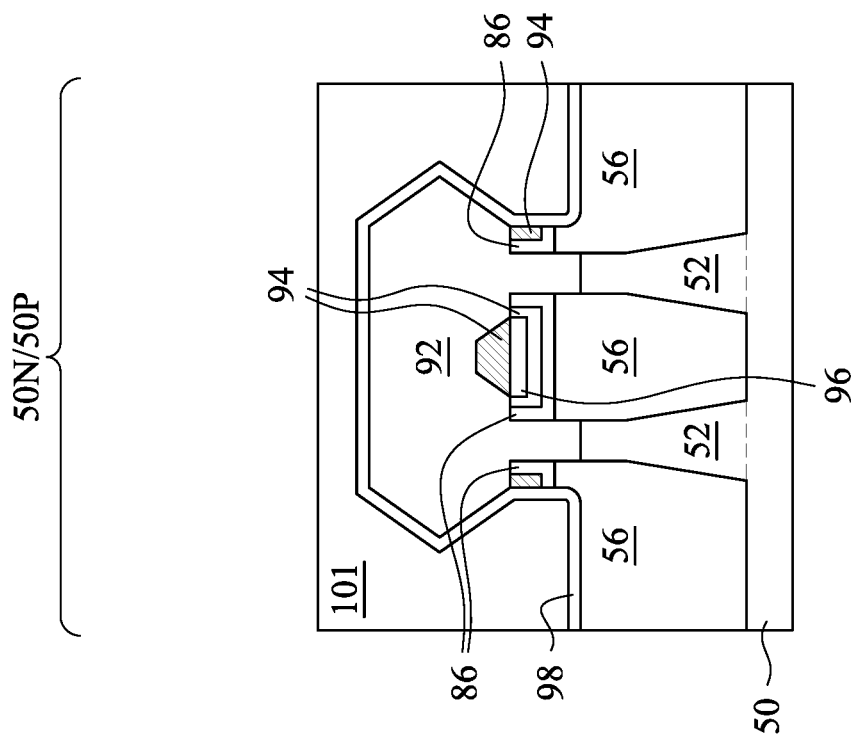
Figure 15D:
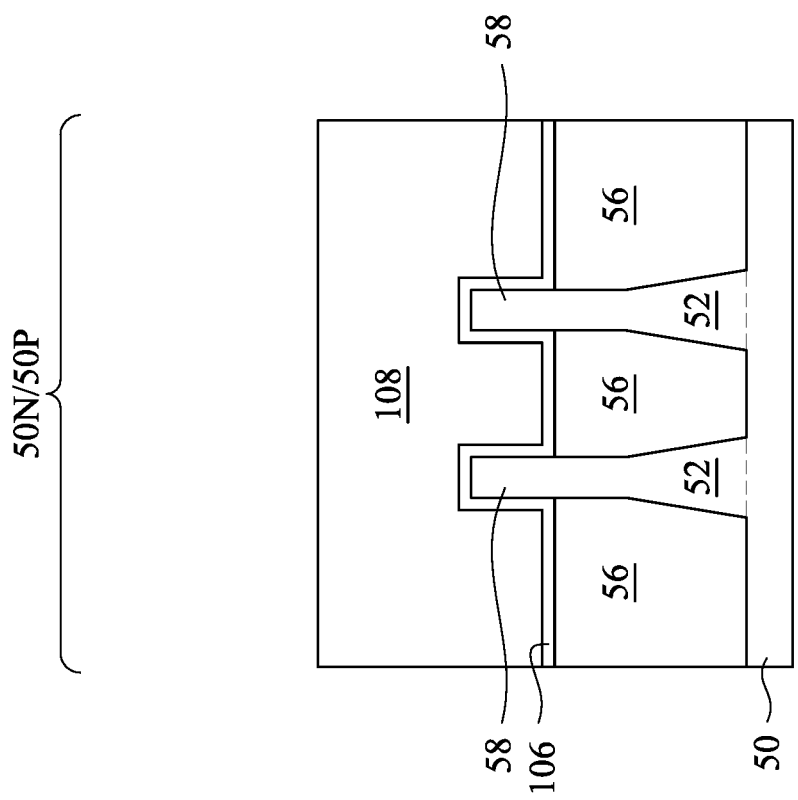

In FIGS. 12A-E, the gate dielectrics 106 and gate electrodes 108 are formed for replacement gates. FIG. 12F illustrates a detailed view of region 11 of FIG. 12B. The gate dielectrics 106 are deposited conformally in the recesses 104, such as on the top surfaces and the sidewalls of the fins 52 and on sidewalls of the first gate spacers 86. The gate dielectrics 106 may also be formed on top surface of the ILD 101. In accordance with some embodiments, the gate dielectrics 106 comprise silicon oxide, silicon nitride, or multi-layers thereof. In some embodiments, the gate dielectrics 106 include a high-k dielectric material, and in these embodiments, the gate dielectrics 106 may have a k value greater than about 7.0, and may include a metal oxide or a silicate of Hf, Al, Zr, La, Mg, Ba, Ti, Pb, and combinations thereof. The formation methods of the gate dielectrics 106 may include Molecular-Beam Deposition (MBD), ALD, PECVD, and the like. In embodiments where the dummy gate dielectrics 70 remain in the recesses 104, the gate dielectrics 106 include a material of the dummy gate dielectrics 70 (e.g., $SiO_2$).

The gate electrodes 108 are deposited over the gate dielectrics 106, respectively, and fill the remaining portions of the recesses 104. The gate electrodes 108 may include a metal-containing material such as TiN, TiO, TaN, TaC, Co, Ru, Al, W, combinations thereof, or multilayers thereof. For example, although a single layer gate electrode 108 is illustrated in FIGS. 12A-D, the gate electrode 108 may comprise any number of liner layers 108A, any number of work function tuning layers 108B, and a fill material 108C, as illustrated in FIG. 12F. After the filling of the gate electrodes 108, a planarization process, such as a CMP, may be performed to remove the excess portions of the gate dielectrics 106 and the material of the gate electrodes 108, which excess portions are over the top surface of the ILD 101. The remaining portions of material of the gate electrodes 108 and the gate dielectrics 106 thus form replacement gates of the resulting FinFETs. The gate electrodes 108 and the gate dielectrics 106 may sometimes be collectively referred to as "active gate stacks." The active gate stacks may extend along sidewalls of a channel region 58 of the fins 52.

The formation of the gate dielectrics 106 in the region 50N and the region 50P may occur simultaneously such that the gate dielectrics 106 in each region are formed from the same materials, and the formation of the gate electrodes 108 may occur simultaneously such that the gate electrodes 108 in each region are formed from the same materials. In some embodiments, the gate dielectrics 106 in each region may be formed by distinct processes, such that the gate dielectrics 106 may be different materials, and/or the gate electrodes 108 in each region may be formed by distinct processes, such that the gate electrodes 108 may be different materials. Various masking steps may be used to mask and expose appropriate regions when using distinct processes.

In FIGS. 13A-E, the second gate spacers 88 are removed to extend the voids 94 along the active gate stacks. In accordance with various embodiments, as the high etch selectivity between the second gate spacers 88 and both the first gate spacers 86 and the residual spacers 96, while removing the second gate spacers 88, the first gate spacers 86 and the residual spacers 96 may remain substantially intact. As such, the voids 94 may inherit dimensions and profiles of the second gate spacers 88, which may have a conformal spacing running along the voids 94. In some other embodiments, the layers/features (e.g., 86, 96, 98) adjacent along the voids 94 may also be etched while removing the second gate spacers 88, but in a significantly less amount. As such, the voids 94 may present a non-uniform spacing running along the voids 94. For example, the etch selectivity between the gate spacers 86 and 88, and the etch selectivity between the gate spacers 88 and 96 may be different, which may cause the voids 94 to have different spacings in different sections.

As mentioned above with respect to FIG. 8A, the residual spacers 96 may remain extending the bottom surface and sidewalls of the merged portion of adjacent source/drain regions 92, while forming the source/drain regions 92. Such residual spacers 96 may further protect the source/drain regions 92 during the removal of the second gate spacers 88. Further, as the high etch selectivity between the second gate spacers 88 and the ILD 101, the ILD 101 can remain substantially intact, even without forming a protection helmet on top of it. After removal, the voids 94 separate the active gate stacks from the epitaxial source/drain regions 92. In particular, the voids 94 physically separate portions of the first gate spacers 86 from portions of the CESL 98 and the ILD 101.

The second gate spacers 88 are removed by one or more etching process(es). As noted above, the second gate spacers 88 have high etch selectivity with respect to the material of the first gate spacers 86, the residual spacers 96, and the ILD 101. As such, the etching process(es) can etch the material of the second gate spacers 88 at a higher rate than the material(s) of the first gate spacers 86, the residual spacers 96, and the ILD 101.

In some embodiments, the etching process(es) are a single etching process. The single etching process may include a dry etch process using a plasma, for example, a fluorine-containing plasma (using gaseous hydrogen fluoride (HF) and/or fluorine ($F_2$)). HF can help remove Ge partially due to migration of the hydrogen atoms. The etching process includes a process that is performed below about 50° C., specifically below about 40° C., and more specifically in the range of about 25° C. to 35° C. The active gate stacks have less lateral support when the voids 94 are extended along the active gate stacks. Performing the single etching process at a low temperature and pressure may help avoid deformation of the active gate stacks when the lateral support is decreased.

In some embodiments, the etching process(es) include multiple etching processes, for example, a first etching process and a second etching process. As noted above, the second gate spacers 88 may be doped with impurities of the epitaxial source/drain regions 92 when forming the epitaxial source/drain regions 92, and upper regions may be doped to a higher impurity concentration than lower regions. The first etching process has a higher etch rate at higher impurity concentrations, and is used to remove the upper regions of the second gate spacers 88, and the second etching process has a higher etch rate at lower impurity concentrations, and is used to remove the lower regions of the second gate spacers 88. Each of the first and second etching processes may include a dry etch process using a plasma, for example, a fluorine-containing plasma (using gaseous hydrogen fluoride (HF) and/or fluorine ($F_2$)). Each of the first and second etching processes includes a process that is performed below about 50° C., specifically below about 40° C., and more specifically in the range of about 25° C. to 35° C.

In some embodiments, the second gate spacers 88 in the regions 50P and 50P may be removed at different rates. In particular, the second gate spacers 88 doped with n-type impurities (e.g., in the region 50N) are removed at a faster rate than the second gate spacers 88 doped with p-type impurities (e.g., in the region 50P). As such, some residue (not shown) may remain in the region 50P but not in the region 50N. The residue may be dielectric material of the second gate spacers 88.

In FIGS. 14A-E, a dielectric layer 114 is formed on the first gate spacers 86, the ILD 101, the gate dielectrics 106, and the gate electrodes 108. The dielectric layer 114 may be formed from a dielectric material such as silicon nitride, silicon oxide, silicon carbonitride, silicon oxycarbonitride, silicon oxycarbide, or the like, and may be formed by a deposition process such as ALD. As shown, the dielectric layer 114 partially fills upper portions of the voids 94. The voids 94 are thus sealed such that materials may not be deposited in the voids 94 during subsequent processing.

In FIGS. 15A-E, a planarization process may be performed to remove the portions of the dielectric layer 114 overlying the ILD 101. The planarization process may be a grinding, a CMP, or the like. Remaining portions of the dielectric layer 114 form dielectric plugs 116, sealing the voids 94. After the planarization process, top surfaces of the ILD 101, dielectric plugs 116, first gate spacers 86, CESL 98, gate dielectrics 106, and gate electrodes 108 are level.

Figure 16:
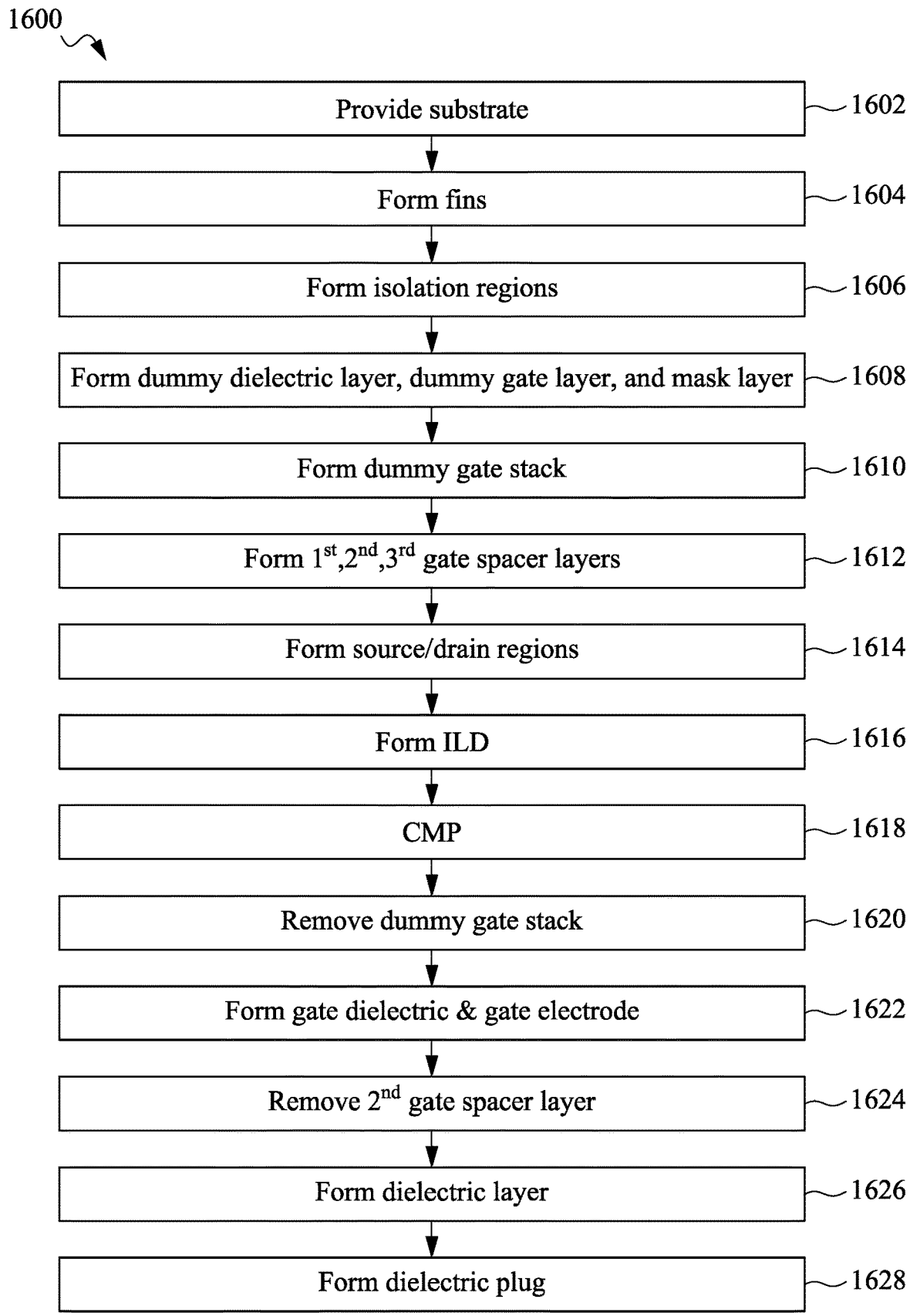
FIG. 16 illustrates a flow chart of an example method for making a non-planar transistor device, in accordance with some embodiments.

FIG. 16 illustrates a flowchart of a method 1600 to form a non-planar transistor device, according to one or more embodiments of the present disclosure. For example, at least some of the operations (or steps) of the method 1600 can be used to form the FinFETs 100. However, it should be understood that some of the operations of the method 1600 can be used to make any of various other types of non-planar devices such as, for example, a nanosheet transistor device, a nanowire transistor device, a vertical transistor device, a gate-all-around (GAA) transistor device, or the like, while remaining within the scope of the present disclosure. It is noted that the method 1600 is merely an example, and is not intended to limit the present disclosure. Accordingly, it is understood that additional operations may be provided before, during, and after the method 1600 of FIG. 16, and that some other operations may only be briefly described herein.

In some embodiments, operations of the method 1600 may be associated with the cross-sectional views of the example FinFETs 100 at various fabrication stages as shown in FIGS. 2, 3, 4, 5, 6, 7A-E, 8A-E, 9A-E, 10A-E, 11A-E, 12A-F, 13A-E, 14A-E, and 15A-E, respectively.

The method 1600 starts with operation 1602 of providing a substrate (e.g., 50 of FIG. 2). The method 1600 continues to operation 1604 of forming a number of fins (e.g., 52 of FIG. 3). The method 1600 continues to operation 1606 of forming isolation regions (e.g., 56 of FIG. 4). The method 1600 continues to operation 1608 of forming a dummy dielectric layer, a dummy gate layer, and a mask layer (e.g., 60, 62, and 64, respectively of FIG. 5). The method 1600 proceeds to operation 1610 of forming one or more dummy gate stacks (e.g., 70 and 72 of FIG. 6). The method 1600 continues to operation 1612 of forming a first gate spacer layer, a second gate spacer layer, and a third gate spacer layer (e.g., 80, 84, and 90, respectively of FIGS. 7A-E). The method 1600 continues to operation 1614 of forming source/drain regions (e.g., 92 of FIGS. 8A-E). The method 1600 continues to operation 1616 of forming an ILD (e.g., 101 of FIGS. 9A-E). The method 1600 continues to operation 1618 of performing a CMP (e.g., FIGS. 10A-E). The method 1600 continues to operation 1620 of removing the dummy gate stack(s) (e.g., FIGS. 11A-E). The method 1600 continues to operation 1622 of forming a gate dielectric and a gate electrode (e.g., 106 and 108, respectively, of FIGS. 12A-F). The method 1600 continues to operation 1624 of removing the second gate spacer layer (e.g., FIGS. 13A-E). By removing the second gate spacer layer, a void may be formed or extended. The method 1600 continues to operation 1626 of forming a dielectric layer (e.g., 114 of FIGS. 14A-E). The method 1600 continues to operation 1628 of forming a dielectric plug (e.g., 116 of FIGS. 15A-E). The dielectric plug is formed by planarizing the dielectric layer so as to seal the void.

Various embodiments of the present disclosure may achieve advantages. The voids 94 include air or a vacuum, both of which have a lower relative permittivity than the dielectric material of the material of the removed second gate spacers 88. At smaller device sizes, the capacitance between source/drain contacts connecting to the source/drain regions 92 (not shown) and gate electrodes 108 may be a significant source of circuit capacitance. Decreasing the relative permittivity of the space between the source/drain contacts and gate electrodes 108 can reduce that capacitance. The capacitance reduction may increase the final device performance of the resulting FinFETs 100.

In one aspect of the present disclosure, a method for making a semiconductor device is disclosed. The method includes forming a first fin over a substrate. The method includes forming a dummy gate stack on the first fin. The method includes forming a first gate spacer along a side of the dummy gate stack. The first gate spacer includes a first dielectric material. The method includes forming a second gate spacer along a side of the first gate spacer. The second gate spacer includes a semiconductor material. The method includes forming a source/drain region in the first fin adjacent the second gate spacer. The method includes removing at least a portion of the second gate spacer to form a void extending between the first gate spacer and the source/drain region.

In another aspect of the present disclosure, a method for a semiconductor device is disclosed. The method includes forming a first fin and a second fin over a substrate. The first and second fins are adjacent to each other. The method includes forming a dummy gate stack on the first and second fins. The method includes forming a first gate spacer along a side of the dummy gate stack, the first gate spacer comprising a first dielectric material. The method includes forming a second gate spacer along a side of the first gate spacer. The second gate spacer including a semiconductor material. The method includes forming a source/drain region in both of the first and second fins adjacent the second gate spacer. The source/drain region includes a merged portion between the first and second fins. The method includes removing at least a portion of the second gate spacer to form a void extending between the first gate spacer and the source/drain region.

In yet another aspect of the present disclosure, a method for making a semiconductor device is disclosed. The method includes forming a fin over a substrate. The method includes forming a dummy gate stack over the fin. The method includes forming a gate spacer along a side of the dummy gate stack. The gate spacer includes a first layer formed of a dielectric material and a second layer formed of a semiconductor material. The method includes forming a source/drain region in the fin adjacent the gate spacer. The method includes replacing the dummy gate stack with an active gate stack. The method includes removing at least a portion of the second layer of the gate spacer to form a void extending between the active gate stack and the source/drain region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for making a semiconductor device, comprising:
    forming a first gate stack over a first fin;
    forming a first gate spacer extending along a side of the first gate stack, the first gate spacer comprising a first dielectric material;
    forming a second gate spacer over the first gate spacer, the second gate spacer comprising silicon germanium;
    forming a third gate spacer over the second gate spacer, the third gate spacer comprising a second dielectric material;
    forming a source/drain region adjacent the third gate spacer;
    depositing an interlayer dielectric (ILD) over the source/drain region, the ILD comprising a third dielectric material; and
    removing at least a portion of the second gate spacer to form a void, while exposing a top surface of the ILD,
    wherein the step of removing at least a portion of the second gate spacer leaves the first gate spacer, the third gate spacer, and the ILD intact.

2. The method of claim 1, wherein the void includes a vertical portion extending between the first gate spacer and the source/drain region, and between the first gate spacer and the ILD.

3. The method of claim 2, wherein the void includes a horizontal portion extending beneath the source/drain region.

4. The method of claim 1, wherein the step of removing at least a portion of the second gate spacer includes performing a dry etch process using at least one of gaseous hydrogen fluoride (HF) or fluorine (F2).

5. The method of claim 1, further comprising:
    depositing a dielectric layer over the void; and
    removing portions of the dielectric layer disposed outside of the void with a planarization process, causing remaining portions of the dielectric layer forming dielectric plugs to seal the void.

6. The method of claim 1, further comprising forming the first gate stack over a second fin in parallel with the first fin, the source/drain region being also formed in the second fin, the void further extending beneath the source/drain region.

7. The method of claim 1, prior to the step of removing at least a portion of the second gate spacer, further comprising replacing the first gate stack with a second gate stack.

8. The method of claim 7, wherein the void extends between the second gate stack and the source/drain region.

9. The method of claim 1, wherein the void includes air or a vacuum.

10. A method for making a semiconductor device, comprising:
    forming a first fin and a second fin over a substrate, the first and second fins in parallel with each other;
    forming a first gate stack on the first and second fins;
    forming a first gate spacer along a side of the dummy gate stack, the first gate spacer comprising a first dielectric material;
    forming a second gate spacer over the first gate spacer, the second gate spacer comprising silicon germanium;
    forming a third gate spacer over the second gate spacer, the third gate spacer comprising a second dielectric material;
    forming a source/drain region in both of the first and second fins adjacent the third gate spacer, the source/drain region comprising a merged portion between the first and second fins to form a void beneath the merged portion; and
    removing at least a portion of the second gate spacer to extend the void.

11. The method of claim 10, further comprising:
    depositing an interlayer dielectric (ILD) over the source/drain region, the ILD comprising a third dielectric material; and
    exposing a top surface of the ILD during the step of removing at least a portion of the second gate spacer.

12. The method of claim 11, wherein the step of removing at least a portion of the second gate spacer leaves the first gate spacer, the third gate spacer, and the ILD intact.

13. The method of claim 10, wherein the step of removing at least a portion of the second gate spacer includes performing a dry etch process using at least one of gaseous hydrogen fluoride (HF) or fluorine (F2).

14. The method of claim 11, wherein the extended void includes a vertical portion extending between the first gate spacer and the source/drain region, and between the first gate spacer and the ILD.

15. The method of claim 14, wherein the extended void includes a horizontal portion extending beneath the source/drain region.

16. The method of claim 10, further comprising:
    depositing a dielectric layer over the void; and
    removing portions of the dielectric layer disposed outside of the void with a planarization process, causing remaining portions of the dielectric layer forming dielectric plugs to seal the void.

17. The method of claim 10, wherein the void includes air or a vacuum.

18. A method for making a semiconductor device, comprising:
    forming a first fin and a second fin over a substrate, the first and second fins in parallel with each other;
    forming a first gate stack on the first and second fins;
    forming a first gate spacer along a side of the dummy gate stack, the first gate spacer comprising a first dielectric material;
    forming a second gate spacer over the first gate spacer, the second gate spacer comprising silicon germanium;
    forming a third gate spacer over the second gate spacer, the third gate spacer comprising a second dielectric material;
    forming a source/drain region in both of the first and second fins adjacent the third gate spacer, the source/drain region comprising a merged portion between the first and second fins to form a void beneath the merged portion;
    depositing an interlayer dielectric (ILD) over the source/drain region, the ILD comprising a third dielectric material; and
    removing at least a portion of the second gate spacer to extend the void, while exposing a top surface of the ILD.

19. The method of claim 18, wherein the extended void includes: (i) a vertical portion extending between the first gate spacer and the source/drain region, and between the first gate spacer and the ILD; and (ii) a horizontal portion extending beneath the source/drain region.

20. The method of claim 18, wherein the void includes air or a vacuum.

* * * * *